US012635244B2

(12) United States Patent
Shin et al.

(10) Patent No.:  US 12,635,244 B2
(45) Date of Patent:  May 19, 2026

(54) DISPLAY DEVICE

(71) Applicant: Samsung Display Co., LTD., Yongin-si (KR)

(72) Inventors: Dong Hee Shin, Asan-si (KR); No Kyung Park, Hwaseong-si (KR); Min Kyu Woo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 671 days.

(21) Appl. No.: 18/080,891

(22) Filed: Dec. 14, 2022

(65) Prior Publication Data

US 2023/0268350 A1     Aug. 24, 2023

(30) Foreign Application Priority Data

Feb. 22, 2022     (KR) ........................ 10-2022-0022934

(51) Int. Cl.
| | |
|---|---|
| *H10D 86/60* | (2025.01) |
| *H10D 86/40* | (2025.01) |
| *H10H 20/857* | (2025.01) |
| *H10W 90/00* | (2026.01) |

(52) U.S. Cl.
CPC ........... *H10D 86/60* (2025.01); *H10D 86/441* (2025.01); *H10H 20/857* (2025.01); *H10W 90/00* (2026.01)

(58) Field of Classification Search
CPC .... H10D 86/60; H10D 86/441; H01L 25/167; H01L 25/0753; H10H 20/857; G09G 2300/0426; G09G 2300/0452; G09G 3/006; G09G 3/20; G09G 3/32; H10K 59/131
See application file for complete search history.

(56) References Cited

U.S. PATENT DOCUMENTS

| | | | |
|---|---|---|---|
| 10,312,309 | B2 | 6/2019 | Lin et al. |
| 10,629,664 | B2 | 4/2020 | Lin et al. |
| 11,101,337 | B2 | 8/2021 | Che et al. |
| 11,257,883 | B2 | 2/2022 | Lin et al. |
| 11,342,395 | B2 | 5/2022 | Lin et al. |
| 11,415,851 | B2 | 8/2022 | Shin et al. |

(Continued)

FOREIGN PATENT DOCUMENTS

| | | |
|---|---|---|
| KR | 10-2014-0081482 | 7/2014 |
| KR | 10-2018-0049005 | 5/2018 |

(Continued)

*Primary Examiner* — Victor A Mandala

(74) *Attorney, Agent, or Firm* — Womble Bond Dickinson (US) LLP

(57) ABSTRACT

A display device includes a data line disposed on a substrate and extending in a first direction, a first gate line disposed on the data line and extending in a second direction intersecting the first direction, a voltage line extending in the second direction, the voltage line and the first gate line disposed on a same layer, first and second metal patterns extending in the first direction, the first metal patterns, the second metal patterns, and the data line disposed on a same layer, and third and fourth metal patterns extending in the first direction, the third and the fourth metal patterns disposed on at least one of the first and the second metal patterns. The first metal patterns and the third metal patterns are electrically connected to the first gate line, and the second metal patterns and the fourth metal patterns are electrically connected to the voltage line.

19 Claims, 14 Drawing Sheets

(56)  References Cited

U.S. PATENT DOCUMENTS

| | | | | |
|---|---|---|---|---|
| 11,437,460 | B2* | 9/2022 | Cha | H10K 59/121 |
| 11,665,933 | B2 | 5/2023 | Lin et al. | |
| 11,694,591 | B2* | 7/2023 | Hong | G09G 3/2003 |
| | | | | 345/690 |
| 11,714,325 | B2 | 8/2023 | Shin et al. | |
| 11,869,873 | B2* | 1/2024 | Shin | H01L 25/167 |
| 12,025,894 | B2 | 7/2024 | Shin et al. | |
| 2021/0376045 | A1* | 12/2021 | Lee | H10K 59/121 |
| 2021/0376050 | A1* | 12/2021 | Ra | H10K 59/1315 |
| 2022/0208935 | A1* | 6/2022 | Kim | H01L 25/0753 |
| 2022/0301493 | A1* | 9/2022 | Shin | G09G 3/3233 |
| 2022/0328600 | A1* | 10/2022 | Dong | H10K 59/1213 |
| 2022/0406817 | A1* | 12/2022 | Park | H01L 25/0753 |
| 2023/0033341 | A1* | 2/2023 | Shin | H01L 25/167 |
| 2023/0163138 | A1* | 5/2023 | Shin | H01L 25/0753 |
| | | | | 257/88 |
| 2023/0215983 | A1* | 7/2023 | Sheen | H10H 20/8312 |
| | | | | 257/79 |
| 2023/0246146 | A1* | 8/2023 | Shin | H01L 25/0753 |
| | | | | 257/79 |
| 2023/0276666 | A1* | 8/2023 | Shin | H10K 59/131 |
| 2023/0360609 | A1* | 11/2023 | Son | G09G 3/3266 |
| 2024/0258360 | A1* | 8/2024 | Park | H10H 20/857 |
| 2024/0353723 | A1 | 10/2024 | Shin et al. | |

FOREIGN PATENT DOCUMENTS

| | | |
|---|---|---|
| KR | 10-2018-0062574 | 6/2018 |
| KR | 10-2037406 | 11/2019 |
| KR | 10-2020-0088951 | 7/2020 |
| KR | 10-2021-0089565 | 7/2021 |
| KR | 10-2021-0127847 A | 10/2021 |
| KR | 10-2023-0017947 | 2/2023 |

* cited by examiner

FIG. 2

MTL1: BMP1
MTL2: AUP1,GTP1
MTL3: AUP2, HGLn+1, VSL

MTL1: BMP1, BMP2
MTL2: AUP1, GTP1
MTL3: AUP2, HGLn+1, VSL

MTL1: VDL, CPE2, VIL, DL1
ACTL: DE1, ACT1, SE1, SE2, ACT2, DE2
MTL2: GE1, CPE1, GE2
MTL3: CE1, CE2, CE3, CE4

MTL1: VDL
ACTL: DE, ACT, SE
MTL2: GE
MTL3: VSL, CE, CE2
MTL4: RME1, RME2, RME3

DISPLAY DEVICE

CROSS-REFERENCE TO RELATED APPLICATION

This application claims priority to and benefit of Korean Patent Application No. 10-2022-0022934 under 35 U.S.C. 119, filed on Feb. 22, 2022, in the Korean Intellectual Property Office (KIPO), the contents of which are incorporated by reference in its entirety.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device, and an organic light emitting display device. Among the flat panel display devices, in the light emitting display device, since each of pixels of a display panel includes a light emitting element capable of emitting light by itself, an image can be displayed without a backlight unit providing light to the display panel. The light emitting element may be an organic light emitting diode using an organic material as a fluorescent material and an inorganic light emitting diode using an inorganic material as a fluorescent material.

SUMMARY

Aspects of the disclosure provide a display device, capable of ensuring reliability, in which pixel areas are recognized identically in an optical inspection.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a data line disposed on a substrate and extending in a first direction, a first gate line disposed on the data line and extending in a second direction intersecting the first direction, a voltage line extending in the second direction, the voltage line and the first gate line disposed on a same layer, first metal patterns and second metal patterns extending in the first direction, the first metal patterns, the second metal patterns, and the data line disposed on a same layer, and third metal patterns and fourth metal patterns extending in the first direction, the third metal patterns and the fourth metal patterns disposed on at least one of the first metal patterns and the second metal patterns. The first metal patterns and the third metal patterns may be electrically connected to the first gate line, and the second metal patterns and the fourth metal patterns may be electrically connected to the voltage line.

The first metal patterns and the second metal patterns may have a same shape, and the third metal patterns and the fourth metal patterns may have a same shape.

The first to fourth metal patterns may be collinear with each other in the first direction.

The first metal patterns and the third metal patterns may be alternately electrically connected to form a second gate line extending in the first direction.

The display device may further include a flexible film disposed on a side of the substrate, and a display driver disposed on the flexible film. The second gate line may supply a gate signal received from the display driver to the first gate line.

The second metal patterns and the fourth metal patterns may be alternately electrically connected to form a line pattern extending in the first direction.

The first metal patterns and the second metal patterns may be spaced apart from each other, and the first gate line or the voltage line may be disposed between the first metal patterns and the second metal patterns.

The first metal patterns may be spaced apart from each other, and the first metal patterns may be electrically connected to each other through a corresponding one of the third metal patterns.

The second metal patterns may be spaced apart from each other, and the second metal patterns may be electrically connected to each other through a corresponding one of the fourth metal patterns.

The first gate line may be electrically connected to a corresponding one of the third metal patterns through a contact portion.

The third metal patterns may be insulated from the second metal patterns and partially overlap a corresponding one of the second metal patterns in a thickness direction.

The third metal patterns may be insulated from the voltage line and overlap the voltage line in a thickness direction.

The display device may further include pixels electrically connected to the data line and the first gate line. The voltage line may supply a low potential voltage to the pixels.

According to an embodiment of the disclosure, a display device may include a data line extending in a first direction, a first gate line disposed on the data line and extending in a second direction intersecting the first direction, first metal patterns and second metal patterns extending in the first direction, the first metal patterns, the second metal patterns, and the data line disposed on a same layer, and third metal patterns and fourth metal patterns extending in the first direction, the third metal patterns and the fourth metal patterns disposed on at least one of the first metal patterns and the second metal patterns. The first metal patterns and the third metal patterns may be electrically connected to the first gate line, and the second metal patterns and the fourth metal patterns may be electrically connected to each other and insulated from the first gate line.

The display device may further include a voltage line extending in the second direction, the voltage line and the first gate line disposed on a same layer. The second metal patterns and the fourth metal patterns may be electrically connected to the voltage line.

The first metal patterns and the second metal patterns may have a same shape, and the third metal patterns and the fourth metal patterns may have a same shape.

According to an embodiment of the disclosure, a display device may include a data line included in a first metal layer disposed on a substrate and extending in a first direction, first metal patterns and second metal patterns included in the first metal layer extending in the first direction, third metal patterns and fourth metal patterns included in a second metal layer extending in the first direction, the second metal payer disposed on the first metal layer, a first gate line included in a third metal layer extending in a second direction intersecting the first direction, the third metal layer disposed on the second metal layer, and a second gate line formed by alternately electrically connecting the first metal patterns and the third metal patterns, the second gate line extending in the first direction. At least one of the third metal patterns may partially overlap one of the second metal patterns in a thickness direction, and the third metal patterns and the second metal patterns may be insulated from each other.

The display device may further include an auxiliary gate line included in the second metal layer electrically connected to the first gate line, and a pixel receiving a gate signal from the auxiliary gate line.

The display device may further include a first voltage line included in the first metal layer extending in the first direction, and a second voltage line included in the third metal layer extending in the second direction. The first voltage line may supply a high potential voltage to the pixel, and the second voltage line may supply a low potential voltage to the pixel.

The second metal patterns and the fourth metal patterns may receive a low potential voltage from the second voltage line.

In the display device according to embodiments, first metal patterns and second metal patterns having the same shape included in a first metal layer, and third metal patterns and fourth metal patterns having the same shape included in a second metal layer may be included, and the first metal patterns and the third metal patterns may be electrically connected to form a vertical gate line, and the second metal patterns and the fourth metal patterns may be electrically connected to form a line pattern, thereby may be recognized identically in the pixel areas in the optical inspection although the lengths of the vertical gate lines and the lengths of the line patterns may vary depending on the position of the contact portion.

Accordingly, the display device may secure reliability by accurately determining the possibility of a defect in the optical inspection process of the pixel areas.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which:

FIG. 2 is a plan view illustrating a contact portion of a vertical gate line and a horizontal gate line in a display device according to an embodiment;

DETAILED DESCRIPTION OF THE EMBODIMENTS

Figure 1:
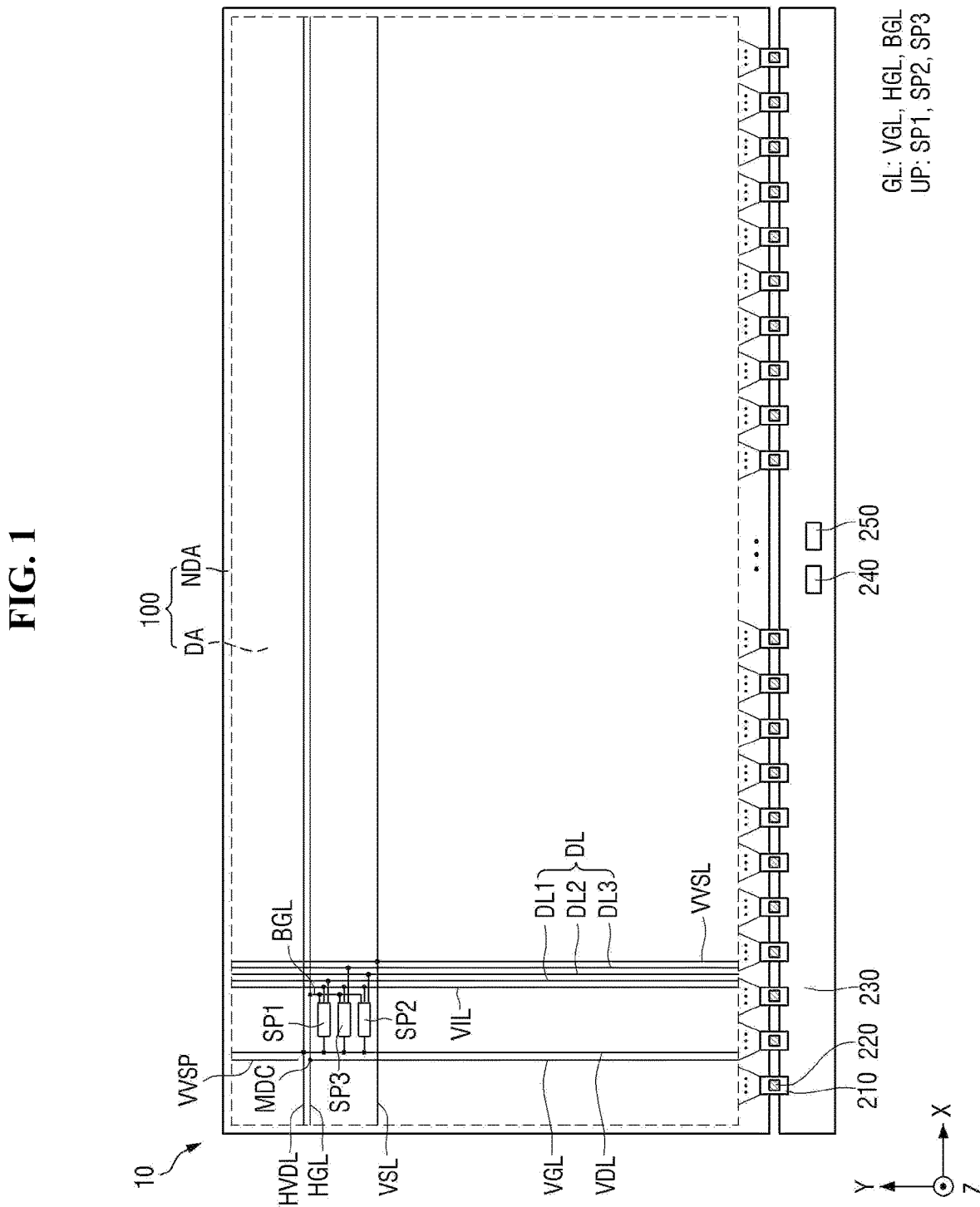
FIG. 1 is a plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a plan view illustrating a display device according to an embodiment.

The terms "above," "top" and "top surface" as used herein may refer to an upward direction (i.e., a Z-axis direction) with respect to the display device. The terms "below," "bottom" and "bottom surface" as used herein may refer to a downward direction (i.e., a direction opposite to the Z-axis direction) with respect to the display device. Further, the terms "left," "right," "upper," and "lower" may respectively indicate corresponding directions on the surface of the display device. For example, the term "left" may indicate a direction opposite to an X-axis direction, the term "right" may indicate the X-axis direction, the term "upper" may indicate a Y-axis direction, and the term "lower" may indicate a direction opposite to the Y-axis direction.

Referring to FIG. 1, a display device 10, as a device for displaying a moving or still image, may be employed as a display screen of various products such as a television, a laptop computer, a monitor, a billboard, and an Internet of Things (IoT) device as well as portable electronic devices such as a mobile phone, a smartphone, a tablet personal computer (PC), a smart watch, a watch phone, a mobile communication terminal, an electronic notebook, an eBook reader, a portable multimedia player (PMP), a navigation device, and an ultra-mobile PC (UMPC).

The display device 10 may include a display panel 100, a flexible film 210, a display driver 220, a circuit board 230, a timing controller 240, and a power supply part 250.

The display panel 100 may have a rectangular shape in a plan view. For example, the display panel 100 may have a rectangular shape in a plan view, having long sides in a first direction (X-axis direction) and short sides in a second direction (Y-axis direction). A corner formed by the long side in the first direction (X-axis direction) and the short side in the second direction (Y-axis direction) may be right-angled or rounded with a predetermined (or selectable) curvature. The planar shape of the display panel 100 is not limited to the rectangular shape, and may be formed in another polygonal shape, a circular shape or an elliptical shape. For example, the display panel 100 may be formed to be flat, but is not limited thereto. In another embodiment, the display panel 100 may be bent with a predetermined (or selectable) curvature.

The display panel 100 may include a display area DA and a non-display area NDA.

The display area DA, which is an area for displaying an image, may be defined as a central area of the display panel 100. The display area DA may include pixels SP, gate lines GL, data lines DL, initialization voltage lines VIL, first voltage lines VDL, horizontal voltage lines HVDL, vertical voltage lines VVSL, second voltage lines VSL, and line patterns VVSP. The pixel SP may be formed in each pixel area at intersections of the data lines DL and the gate lines GL. The pixels SP may include first to third pixels SP1, SP2, and SP3. Each of the first to third pixels SP1, SP2, and SP3 may be electrically connected to a horizontal gate line HGL and a data line DL. Each of the first to third pixels SP1, SP2, and SP3 may be defined as a minimum unit area that outputs light.

The first pixel SP1 may emit light of a first color such as red light, the second pixel SP2 may emit light of a second color such as green light, and the third pixel SP3 may emit light of a third color such as blue light. Pixel circuits of the first pixel SP1, the third pixel SP3 and the second pixel SP2 may be arranged in the opposite direction of the second direction (Y-axis direction), but the arrangement direction of the pixel circuits is not limited thereto.

The gate line GL may include a vertical gate line VGL, a horizontal gate line HGL, and an auxiliary gate line BGL.

The vertical gate lines VGL may be electrically connected to a display driver 220 extending in the second direction (Y-axis direction) and may be spaced apart from each other in the first direction (X-axis direction). The vertical gate line VGL may be a second gate line. The vertical gate lines VGL may be disposed in parallel with the data lines DL. The horizontal gate lines HGL may extend in the first direction (X-axis direction) and may be spaced apart from each other in the second direction (Y-axis direction). The horizontal gate line HGL may be a first gate line. Each of the horizontal gate lines HGL may intersect the vertical gate lines VGL. For example, a horizontal gate line HGL may be electrically connected to one of the vertical gate lines VGL through a contact portion MDC. The contact portion MDC may correspond to a portion in which the horizontal gate line HGL is disposed in a contact hole and contacts the vertical gate line VGL. The auxiliary gate line BGL may extend from the horizontal gate line HGL to supply gate signals to first to third pixels SP1, SP2, and SP3.

The data lines DL may extend in the second direction (Y-axis direction) and may be spaced apart from each other in the first direction (X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (Y-axis direction) and may be spaced apart from each other in the first direction (X-axis direction). The initialization voltage line VIL may supply an initialization voltage received from the display driver 220 to the pixel circuit of each of the first to third pixels SP1, SP2 and SP3. The initialization voltage line VIL may receive a sensing signal from the pixel circuit of each of the first to third pixels SP1, SP2 and SP3 to supply the sensing signal to the display driver 220.

The first voltage lines VDL may extend in the second direction (Y-axis direction) and may be spaced apart from each other in the first direction (X-axis direction). The first voltage line VDL may supply a driving voltage or a high potential voltage received from a power supply part 250 to the first to third pixels SP1, SP2, and SP3.

Horizontal voltage lines HVDL may extend in the first direction (X-axis direction) and may be spaced apart from each other in the second direction (Y-axis direction). The horizontal voltage line HVDL may be electrically connected to the first voltage line VDL. The horizontal voltage line HVDL may supply a driving voltage or a high potential voltage to the first voltage line VDL.

The vertical voltage lines VVSL may extend in the second direction (Y-axis direction) and may be spaced apart from each other in the first direction (X-axis direction). The vertical voltage line VVSL may be electrically connected to the second voltage line VSL. The vertical voltage line VVSL may supply a low potential voltage received from the power supply part 250 to the second voltage line VSL.

The second voltage lines VSL may extend in the first direction (X-axis direction) and may be spaced apart from each other in the second direction (Y-axis direction). The second voltage line VSL may supply the low potential voltage to the first to third pixels SP1, SP2, and SP3.

The line patterns VVSP may extend in the second direction (Y-axis direction) and may be spaced apart from each other in the first direction (X-axis direction). The line pattern VVSP may be electrically connected to the vertical voltage line VVSL and the second voltage line VSL, thereby reducing an RC delay of the second voltage line VSL and securing a driving margin. The line pattern VVSP may be disposed collinearly with the vertical gate line VGL. For example, the vertical gate line VGL may extend from a side of the display area DA to the contact portion MDC in the second direction (Y-axis direction), and the line pattern VVSP may extend from a region adjacent to the contact portion MDC to another side of the display area DA in the second direction (Y-axis direction). The line pattern VVSP may be electrically insulated from the vertical gate line VGL.

The connection relationship between the pixel SP, the gate line GL, the data line DL, the initialization voltage line VIL, the first voltage line VDL, and the second voltage line VSL may be changed in design according to the number and arrangement of the pixels SP.

The non-display area NDA may be defined as an area of the display panel 100 other than the display area DA. For example, the non-display area NDA may include fan-out lines electrically connecting the vertical gate line VGL, the data line DL, the initialization voltage line VIL, the first voltage line VDL, and the vertical voltage line VVSL to the display driver 220, and a pad portion (not shown) electrically connected to the flexible film 210.

Input terminals provided on a side of the flexible film 210 may be attached to the circuit board 230 by a film attaching process, and output terminals provided on another side of the flexible film 210 may be attached to the pad portion by the film attaching process. For example, the flexible film 210 may be a flexible film that can be bent, such as a tape carrier package or a chip on film. The flexible film 210 may be bent toward the lower portion of the display panel 100 to reduce the bezel area of the display device.

The display driver 220 may be mounted on the flexible film 210. For example, the display driver 220 may be implemented as an integrated circuit (IC). The display driver 220 may receive digital video data and a data control signal from the timing controller 240, and according to the data control signal, the display driver 220 may convert the digital video data to an analog data voltage to supply it to the data lines DL through the fan-out lines. The display driver 220 may generate a gate signal according to a gate control signal supplied from the timing controller 240, and may sequentially supply the gate signal to the vertical gate lines VGL in an order. Accordingly, the display driver 220 may simultaneously function as a data driver and a gate driver. Since the display device 10 includes the display driver 220 disposed on the lower side of the non-display area NDA, sizes of the left side, right side, and upper side of the non-display area NDA may be minimized.

A circuit board 230 may support a timing controller 240 and the power supply part 250, and may supply signals and power to the display driver 220. For example, the circuit board 230 may supply a signal supplied from the timing controller 240 and a power voltage supplied from the power supply part 250 to the display driver 220 to display an image on each pixel. A signal line and a power line may be provided on the circuit board 230.

The timing controller 240 may be mounted on the circuit board 230 and may receive image data and a timing synchronization signal supplied from the display driving system or a graphic device through a user connector provided on the circuit board 230. The timing controller 240 may generate digital video data by arranging the image data to fit the pixel arrangement structure based on the timing synchronization signal, and may supply the generated digital video data to the display driver 220. The timing controller 240 may generate the data control signal and the gate control signal based on the timing synchronization signal. The timing controller 240 may control the data voltage supply timing of the display driver 220 based on the data control signal, and may control the gate signal supply timing of the display driver 220 based on the gate control signal.

The power supply part 250 may be disposed on the circuit board 230 to supply a power voltage to the display driver 220 and the display panel 100. For example, the power supply part 250 may generate a driving voltage or a high potential voltage and may supply it to the first voltage line VDL, may generate a low potential voltage and may supply it to the vertical voltage line VVSL, and may generate an initialization voltage and may supply it to the initialization voltage line VIL.

Figure 2:
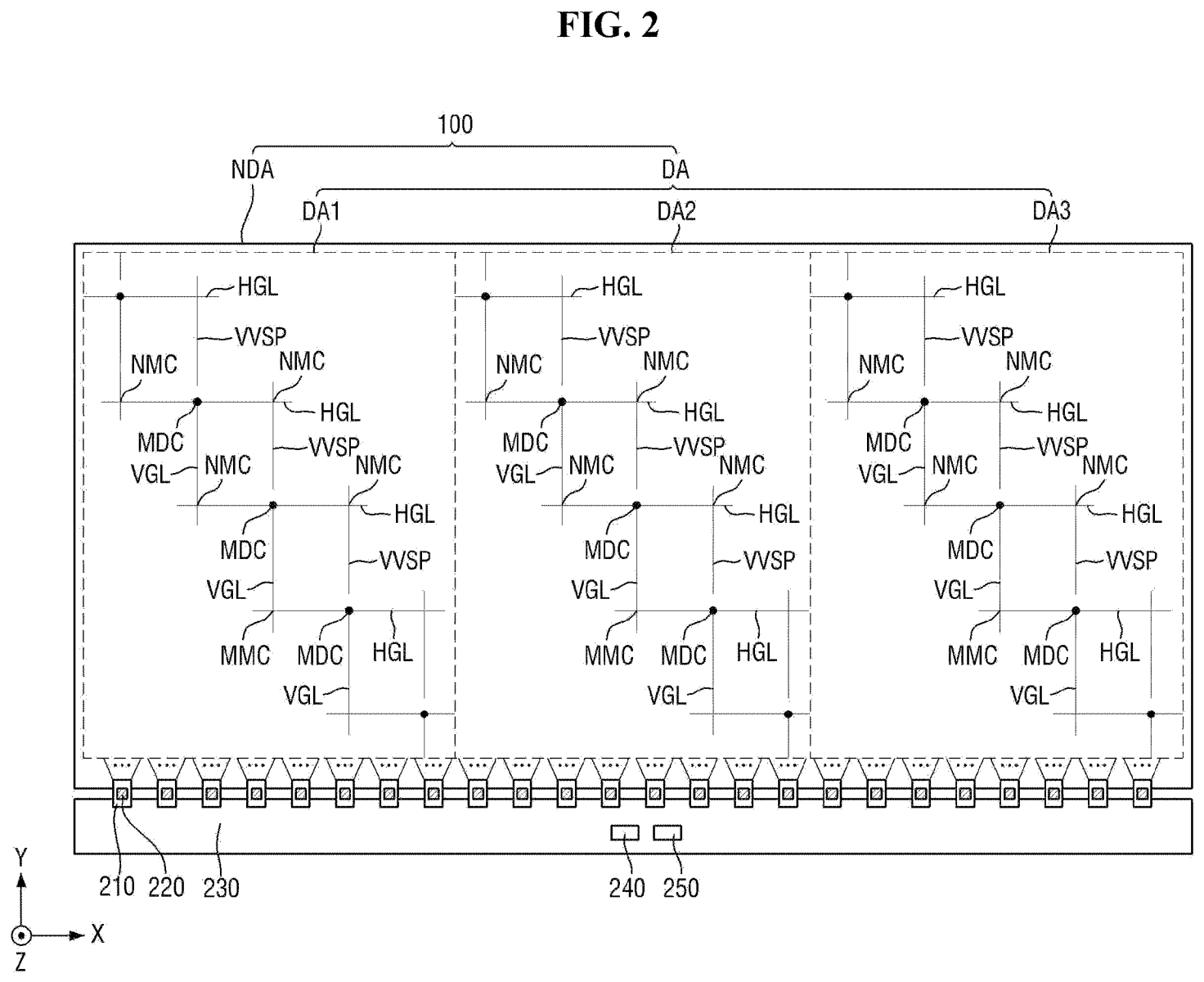

FIG. 2 is a plan view illustrating a contact portion of a vertical gate line and a horizontal gate line in a display device according to an embodiment.

Referring to FIG. 2, the display area DA may include first to third display areas DA1, DA2, and DA3.

Each of the horizontal gate lines HGL may intersect the vertical gate lines VGL. The horizontal gate line HGL may intersect the vertical gate lines VGL in the contact portion MDC and a non-contact portion NMC. For example, a horizontal gate line HGL may be electrically connected to one of the vertical gate lines VGL through a contact portion MDC. A horizontal gate line HGL may be insulated from the vertical gate lines VGL in the non-contact portion NMC.

The contact portions MDC of a first display area DA1 may be disposed on a virtual extension line (or disposed collinearly with each other) extending from the upper left end of the first display area DA1 to the lower right end of the first display area DA1. The contact portion MDC of a second display area DA2 may be disposed on a virtual extension line extending from the upper left end of the second display area DA2 to the lower right end of the second display area DA2. The contact portion MDC of a third display area DA3 may be disposed on a virtual extension line extending from the upper left end of the third display area DA3 to the lower right end of the third display area DA3. Accordingly, the contact portions MDC may be arranged along a diagonal direction between the first direction (X-axis direction) and a direction opposite to the second direction (Y-axis direction) in each of the first to third display areas DA1, DA2, and DA3.

The display device 10 may include a display driver 220 that functions as a data driver and a gate driver. Accordingly, since the data line DL receives a data voltage from the display driver 220 disposed on the lower side of the non-display area NDA, and the vertical gate line VGL receives the gate signal from the display driver 220 disposed on the lower side of the non-display area NDA, the display device 10 may minimize the sizes of the left side, right side, and upper side of the non-display area NDA.

The line pattern VVSP may be disposed on the same line as (or may be collinear with) the vertical gate line VGL. For example, the vertical gate line VGL may extend from a side of the display area DA to the contact portion MDC in the second direction (Y-axis direction), and the line pattern VVSP may extend from a region adjacent to the contact portion MDC to another side of the display area DA in the second direction (Y-axis direction). The line pattern VVSP may be electrically insulated from the vertical gate line VGL.

Figure 3:
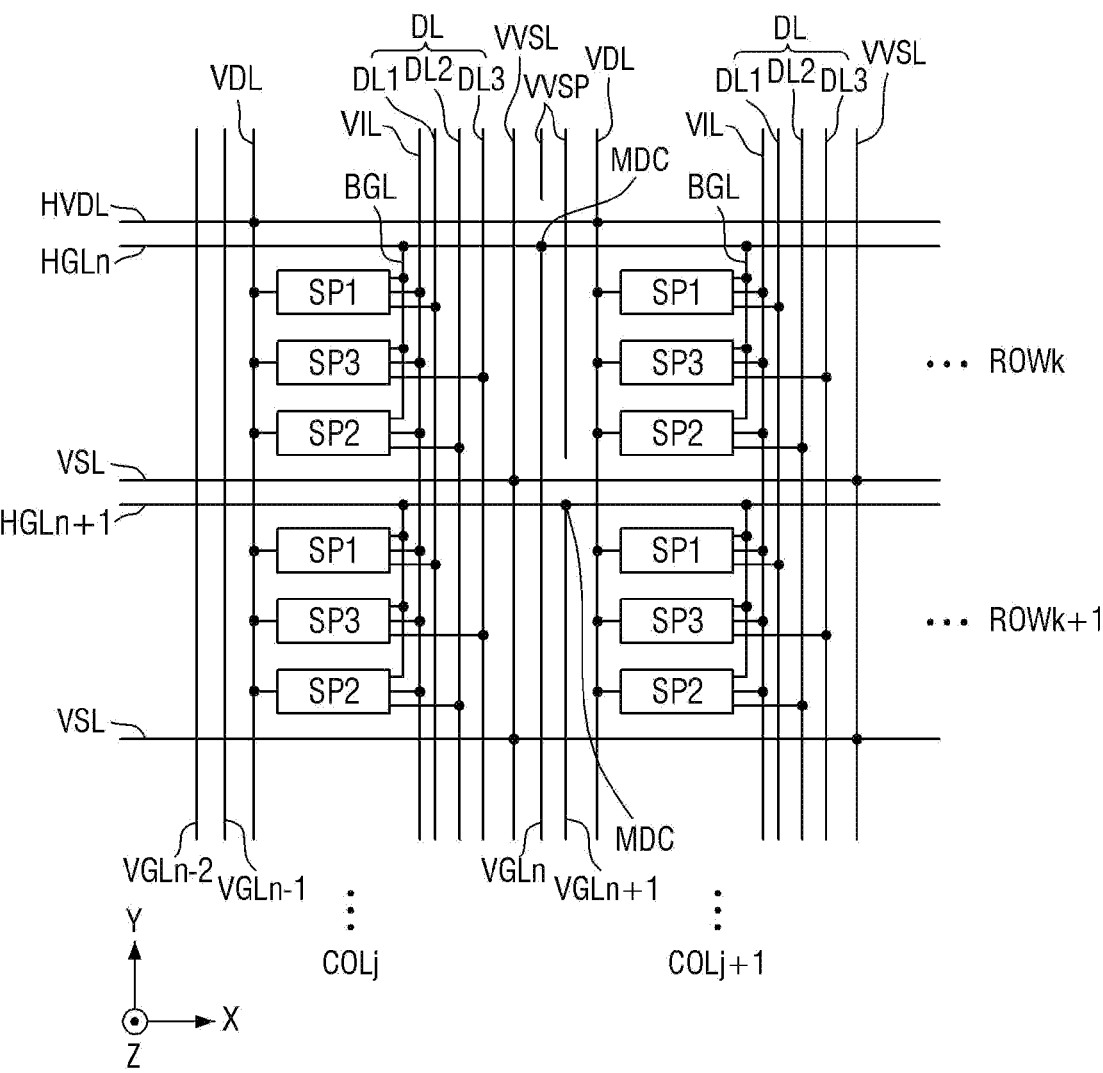
FIG. 3 is a schematic diagram illustrating pixels and lines of a display device according to an embodiment.

FIG. 3 is a schematic diagram illustrating pixels and lines of a display device according to an embodiment.

Referring to FIG. 3, the pixels SP may include first to third pixels SP1, SP2, and SP3. The pixel circuits of the first pixel SP1, the third pixel SP3, and the second pixel SP2 may be arranged in the opposite direction of the second direction (Y-axis direction), but the arrangement direction of the pixel circuits is not limited thereto.

Each of the first to third pixels SP1, SP2, and SP3 may be electrically connected to the first voltage line VDL, the initialization voltage line VIL, the gate line GL, and the data line DL.

A first voltage line VDL may extend in the second direction (Y-axis direction). The first voltage line VDL may be disposed on a side or the left side of the pixel circuits of the first to third pixels SP1, SP2 and SP3. The first voltage line VDL may supply a driving voltage or high potential voltage to a transistor of each of the first to third pixels SP1, SP2 and SP3.

The horizontal voltage line HVDL may extend in the first direction (X-axis direction). The horizontal voltage line HVDL may be disposed on the upper side of the horizontal gate line HGL. The horizontal voltage line HVDL may be electrically connected to the first voltage line VDL. The horizontal voltage line HVDL may supply a driving voltage or a high potential voltage to the first voltage line VDL.

The initialization voltage line VIL may extend in the second direction (Y-axis direction). The initialization voltage line VIL may be disposed on a side or the right side of the auxiliary gate line BGL. The initialization voltage line VIL may be disposed between the auxiliary gate line BGL and the data line DL. The initialization voltage line VIL may supply an initialization voltage to the pixel circuit of each of the first to third pixels SP1, SP2, and SP3. The initialization voltage line VIL may receive a sensing signal from the pixel circuit of each of the first to third pixels SP1, SP2 and SP3 to supply the sensing signal to the display driver 220.

The gate line GL may include a vertical gate line VGL, a horizontal gate line HGL, and an auxiliary gate line BGL.

The vertical gate lines VGL may extend in the second direction (Y-axis direction). At least one vertical gate line VGL may be disposed between adjacent pixels SP in the first direction (X-axis direction). The vertical gate line VGL may be electrically connected between the display driver 220 and the horizontal gate line HGL. Each of the vertical gate lines VGL may intersect the horizontal gate lines HGL. The vertical gate line VGL may supply the gate signal received from the display driver 220 to the horizontal gate line HGL.

For example, an $n^{th}$ vertical gate line VGLn (n being a positive integer) and an $(n+1)^{th}$ vertical gate line VGLn+1 may be disposed between the pixel SP disposed in a $j^{th}$ column COLj (j being a positive integer) and the pixel SP disposed in a $(j+1)^{th}$ column COLj+1. The vertical gate lines VGL may be disposed in parallel between the data line DL electrically connected to the pixels SP arranged on a side and the first voltage line VDL electrically connected to the pixels SP arranged on another side. The $n^{th}$ and $(n+1)^{th}$ vertical gate lines VGLn and VGLn+1 may be disposed between the data line DL electrically connected to the pixel SP disposed in the $j^{th}$ column COLj and the first voltage line VDL electrically connected to the pixel SP disposed in the $(j+1)^{th}$ column COLj+1. The $n^{th}$ vertical gate line VGLn may be electrically connected to the $n^{th}$ horizontal gate line HGLn through the contact portion MDC, and may be insulated from the remaining horizontal gate lines HGL. The (n+1)th vertical gate line VGLn+1 may be electrically connected to the $(n+1)^{th}$ horizontal gate line HGLn+1 through the contact portion MDC, and may be insulated from the remaining horizontal gate lines HGL.

At least one vertical gate line VGL may be disposed on a side of the pixel SP. For example, an $(n-2)^{th}$ vertical gate line VGLn−2 and an $(n-1)^{th}$ vertical gate line VGLn−1 may be disposed on a side of the pixel SP disposed in the $j^{th}$ column COLj. The $(n-2)^{th}$ and $(n-1)^{th}$ vertical gate lines VGLn−2 and VGLn−1 may be disposed on a side of the first voltage line VDL electrically connected to the pixel SP disposed in the $j^{th}$ column COLj.

The horizontal gate line HGL may extend in a first direction (X-axis direction). The horizontal gate line HGL may be disposed on the upper side of the pixel circuit of the first pixel SP1. The horizontal gate line HGL may be electrically connected between the vertical gate line VGL and the auxiliary gate line BGL. The horizontal gate line HGL may supply a gate signal received from the vertical gate line VGL to the auxiliary gate line BGL.

For example, the $n^{th}$ horizontal gate line HGLn may be disposed on the upper side of the pixel circuit of the first pixel SP1 disposed in the kth row ROWk (k being a positive integer. The $n^{th}$ horizontal gate line HGLn may be electrically connected to the $n^{th}$ vertical gate line VGLn through the contact portion MDC and may be insulated from the remaining vertical gate lines VGL. The $(n+1)^{th}$ horizontal gate line HGLn+1 may be disposed on the upper side of the pixel circuit of the first pixel SP1 disposed in the $(k+1)^{th}$ row ROWk+1. The $(n+1)^{th}$ horizontal gate line HGLn+1 may be electrically connected to the $(n+1)^{th}$ vertical gate line VGLn+1 through the contact portion MDC, and may be insulated from the remaining vertical gate lines VGL.

The auxiliary gate line BGL may extend from the horizontal gate line HGL in the opposite direction of the second direction (Y-axis direction). The auxiliary gate line BGL may be disposed on the right side of the pixel circuits of the first to third pixels SP1, SP2 and SP3. The auxiliary gate line BGL may supply the gate signals received from the horizontal gate line HGL to the pixel circuits of the first to third pixels SP1, SP2, and SP3.

The data lines DL may extend in the second direction (the Y-axis direction). The data lines DL may supply a data voltage to the pixels SP. The data lines DL may include first to third data lines DL1, DL2, and DL3.

The first data line DL1 may extend in the second direction (Y-axis direction). The first data line DL1 may be disposed on a side or the right side of the initialization voltage line VIL. The first data line DL1 may supply the data voltage received from the display driver 220 to the pixel circuit of the first pixel SP1.

The second data line DL2 may extend in the second direction (Y-axis direction). The second data line DL2 may be disposed on a side or the right side of the first data line DL1. The second data line DL2 may supply the data voltage received from the display driver 220 to the pixel circuit of the second pixel SP2.

The third data line DL3 may extend in the second direction (Y-axis direction). The third data line DL3 may be disposed on a side or the right side of the second data line DL2. The third data line DL3 may supply the data voltage received from the display driver 220 to the pixel circuit of the third pixel SP3.

The vertical voltage line VVSL may extend in the second direction (Y-axis direction). The vertical voltage line VVSL may be disposed on a side or the right side of the third data line DL3. The vertical voltage line VVSL may be electrically connected between the power supply part 250 and the second voltage line VSL. The vertical voltage line VVSL may supply the low potential voltage supplied from the power supply part 250 to the second voltage line VSL.

The second voltage line VSL may extend in the first direction (X-axis direction). The second voltage line VSL may be disposed below the pixel circuit of the second pixel SP2. The second voltage line VSL may supply the low potential voltage received from the vertical voltage line VVSL to a light emitting element layer of the first to third pixels SP1, SP2, and SP3.

The line pattern VVSP may extend in the second direction (Y-axis direction). The line pattern VVSP may be electrically connected to the vertical voltage line VVSL and the second voltage line VSL, thereby reducing an RC delay of the second voltage line VSL and securing a driving margin. The line pattern VVSP may be disposed collinearly with the vertical gate line VGL. For example, the $n^{th}$ vertical gate line VGLn may extend from a side of the display area DA to the contact portion MDC, and the line pattern VVSP may extend from a region adjacent to the contact portion MDC to another side of the display area DA. The line pattern VVSP may be electrically insulated from the vertical gate line VGL. Accordingly, at least one line pattern VVSP may be disposed between adjacent pixels SP in the first direction (X-axis direction). The line pattern VVSP may intersect the horizontal gate line HGL, the horizontal voltage line HVDL, and the second voltage line VSL.

Figure 4:
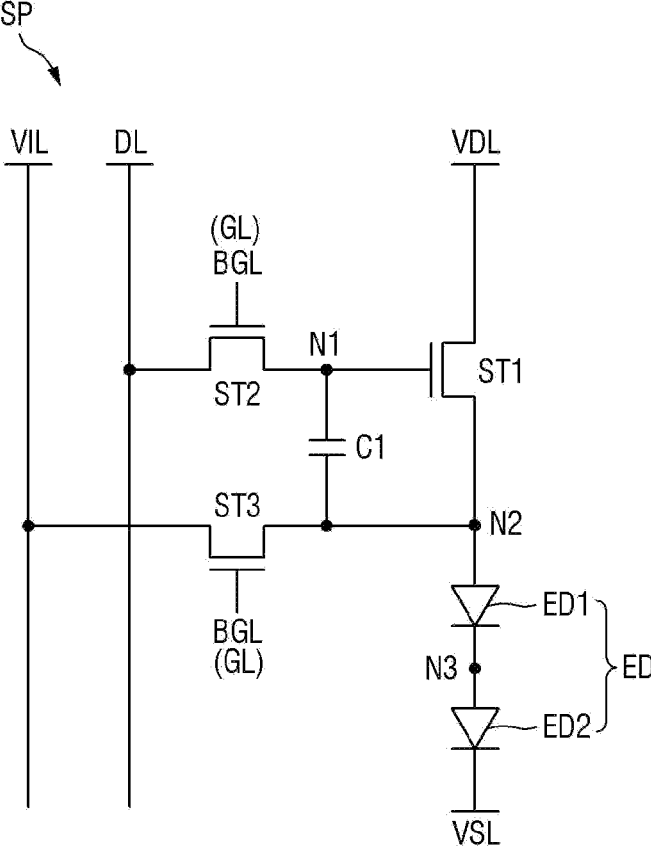
FIG. 4 is a schematic diagram of an equivalent circuit of a pixel of a display device according to an embodiment.

FIG. 4 is a schematic diagram of an equivalent circuit of a pixel of a display device according to an embodiment.

Referring to FIG. 4, each of the pixels SP may be electrically connected to the first voltage line VDL, the data line DL, the initialization voltage line VIL, the auxiliary gate line BGL, and the second voltage line VSL.

Each of the first to third pixels SP1, SP2, and SP3 may include first to third transistors ST1, ST2, and ST3, a first capacitor C1, and multiple light emitting elements ED.

The first transistor ST1 may include a gate electrode, a drain electrode, and a source electrode. The gate electrode of the first transistor ST1 may be electrically connected to a first node N1, the drain electrode thereof may be electrically connected to the first voltage line VDL, and the source electrode thereof may be electrically connected to a second node N2. The first transistor ST1 may control a drain-source current (or driving current) based on a data voltage applied to the gate electrode.

The light emitting elements ED may include a first light emitting element ED1 and a second light emitting element ED2. The first and second light emitting elements ED1 and ED2 may be electrically connected in series. The first and second light emitting elements ED1 and ED2 may receive a driving current to emit light. The light emission amount or the luminance of the light emitting element ED may be proportional to the magnitude of the driving current. The light emitting element ED may be an inorganic light emitting element including an inorganic semiconductor, but is not limited thereto.

The first electrode of the first light emitting element ED1 may be electrically connected to the second node N2, and the second electrode of the first light emitting element ED1 may be electrically connected to a third node N3. The first electrode of the first light emitting element ED1 may be electrically connected to the source electrode of the first transistor ST1, the drain electrode of the third transistor ST3 and a second capacitor electrode of the first capacitor C1 through the second node N2. The second electrode of the first light emitting element ED1 may be electrically connected to the first electrode of the second light emitting element ED2 through the third node N3.

The first electrode of the second light emitting element ED2 may be electrically connected to the third node N3, and the second electrode of the second light emitting element ED2 may be electrically connected to the second voltage line VSL. The first electrode of the second light emitting element ED2 may be electrically connected to the second electrode of the first light emitting element ED1 through the third node N3.

The second transistor ST2 may be turned on by the gate signal of the gate line GL or the auxiliary gate line BGL to electrically connect the data line DL to the first node N1 which is electrically connected to the gate electrode of the first transistor ST1. The second transistor ST2 may be turned on by the gate signal to supply the data voltage to the first node N1. The gate electrode of the second transistor ST2 may be electrically connected to the auxiliary gate line BGL, the drain electrode thereof may be electrically connected to the data line DL, and the source electrode thereof may be electrically connected to the first node N1. The source electrode of the second transistor ST2 may be electrically connected to the gate electrode of the first transistor ST1 and a first capacitor electrode of the first capacitor C1 through the first node N1.

The third transistor ST3 may be turned on by the gate signal of the auxiliary gate line BGL or the gate line GL to electrically connect the initialization voltage line VIL to the second node N2 that is electrically connected to the source electrode of the first transistor ST1. The third transistor ST3 may be turned on by the gate signal to supply the initialization voltage to the second node N2. The gate electrode of the third transistor ST3 may be electrically connected to the auxiliary gate line BGL, the drain electrode thereof may be electrically connected to the second node N2, and the source electrode thereof may be electrically connected to the initialization voltage line VIL. The drain electrode of the third transistor ST3 may be electrically connected to the source electrode of the first transistor ST1, the second capacitor electrode of the first capacitor C1, and the first electrode of the first light emitting element ED1 through the second node N2.

Figure 5:
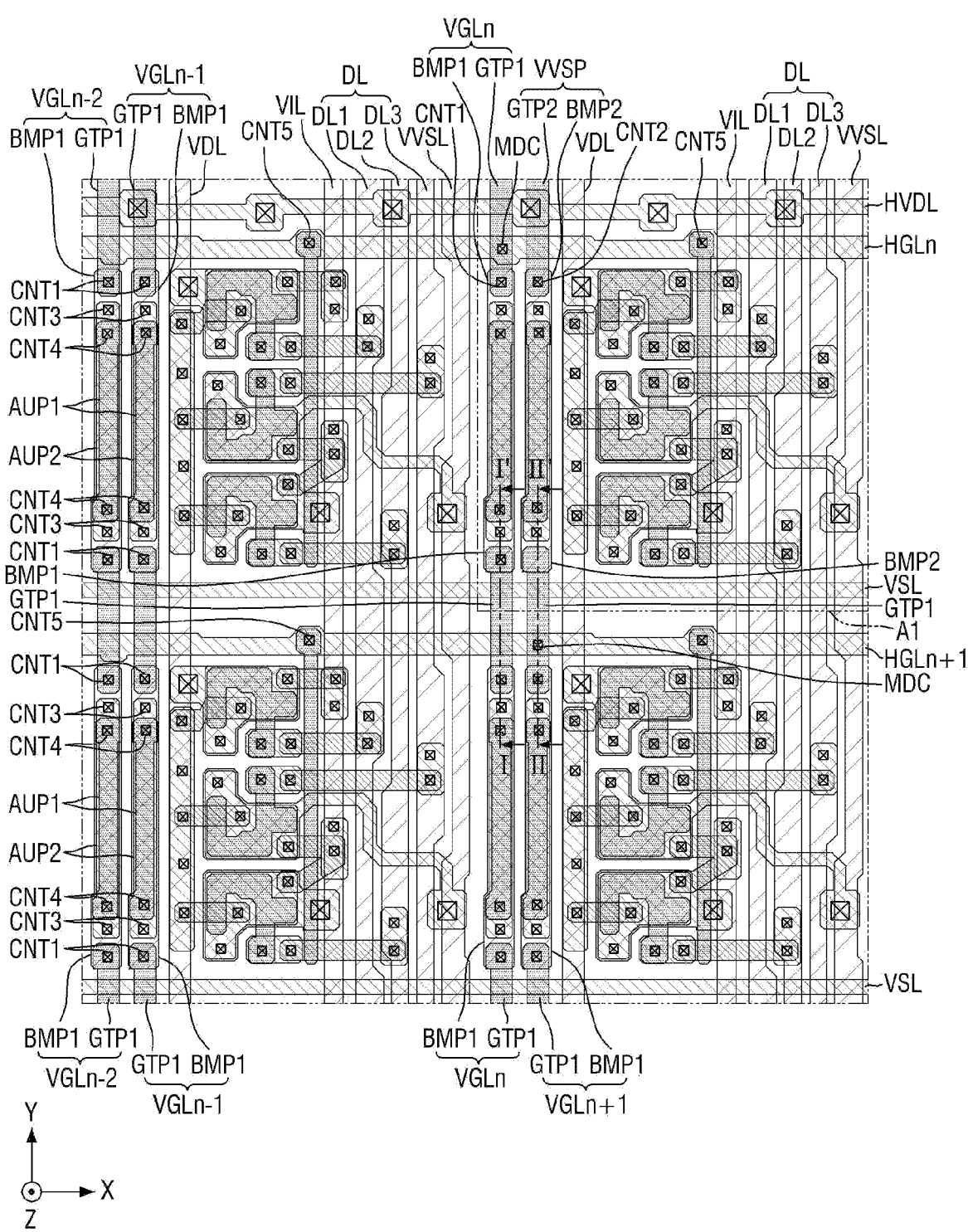
FIG. 5 is a plan view illustrating a part of a display area in a display device according to an embodiment.
Figure 6:
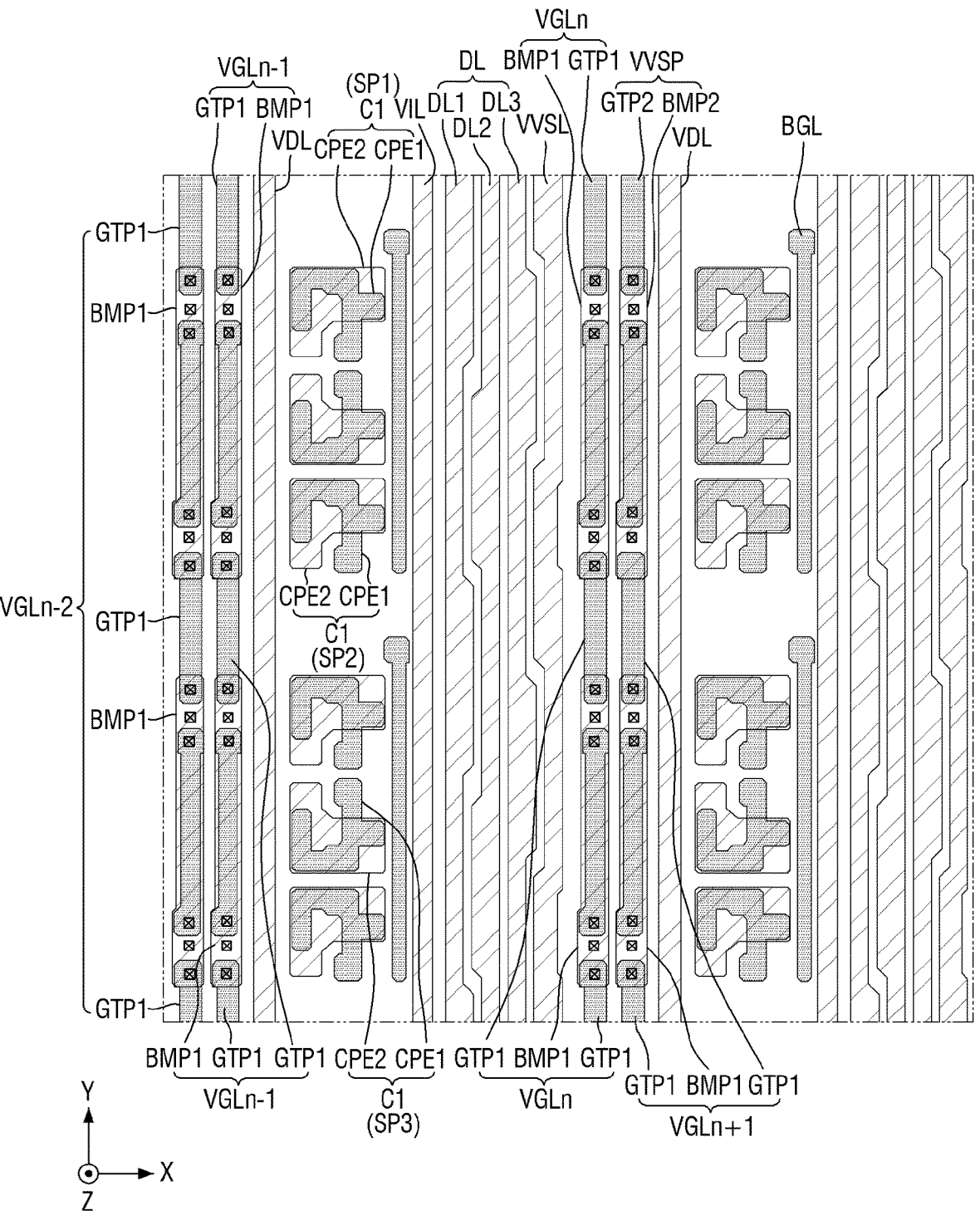
FIG. 6 is a plan view illustrating a first metal layer and a second metal layer in the display device of FIG. 5.
Figure 7:
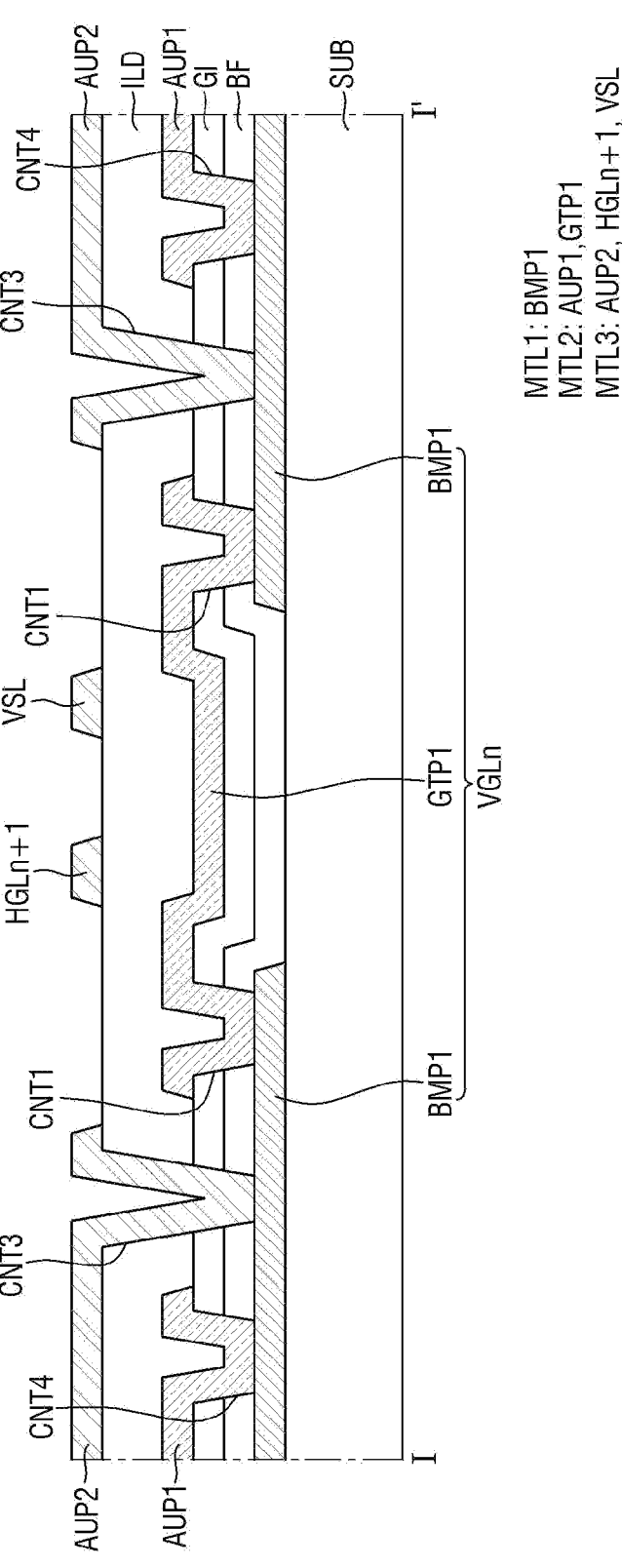
FIG. 7 is a schematic cross-sectional view taken along line I-I' of FIG. 5.
Figure 8:
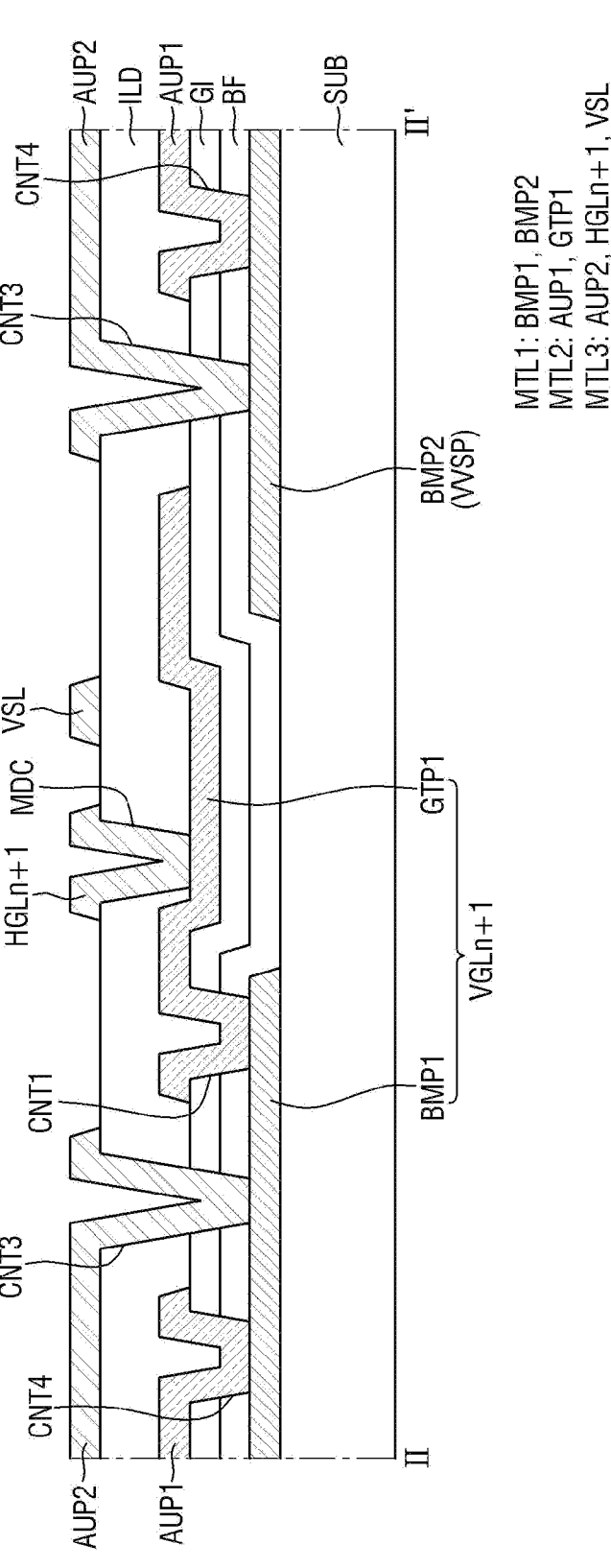
FIG. 8 is a schematic cross-sectional view taken along line II-II' of FIG. 5.
Figure 9:
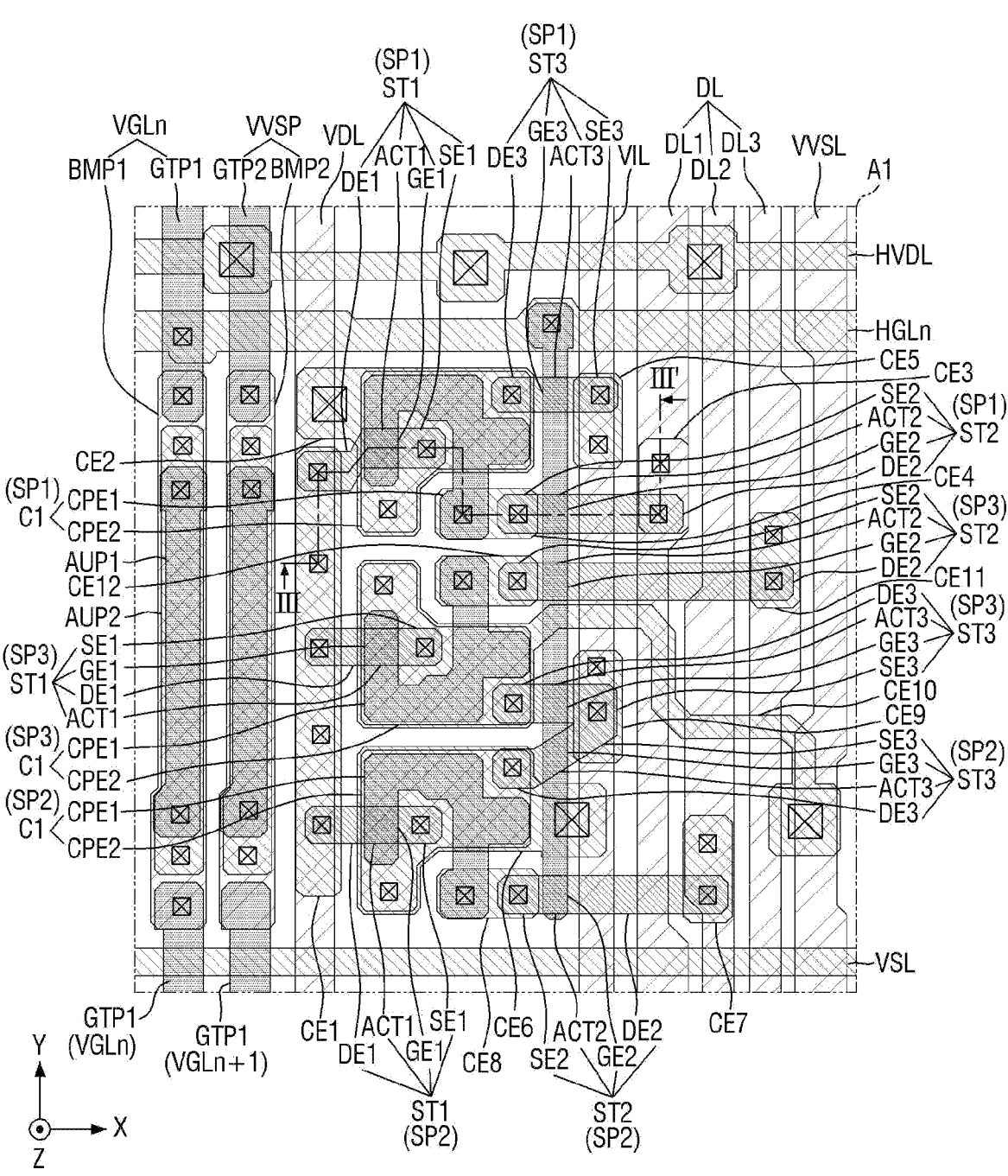
FIGS. 9 and 10 are enlarged views of area A1 of FIG. 5.
Figure 10:
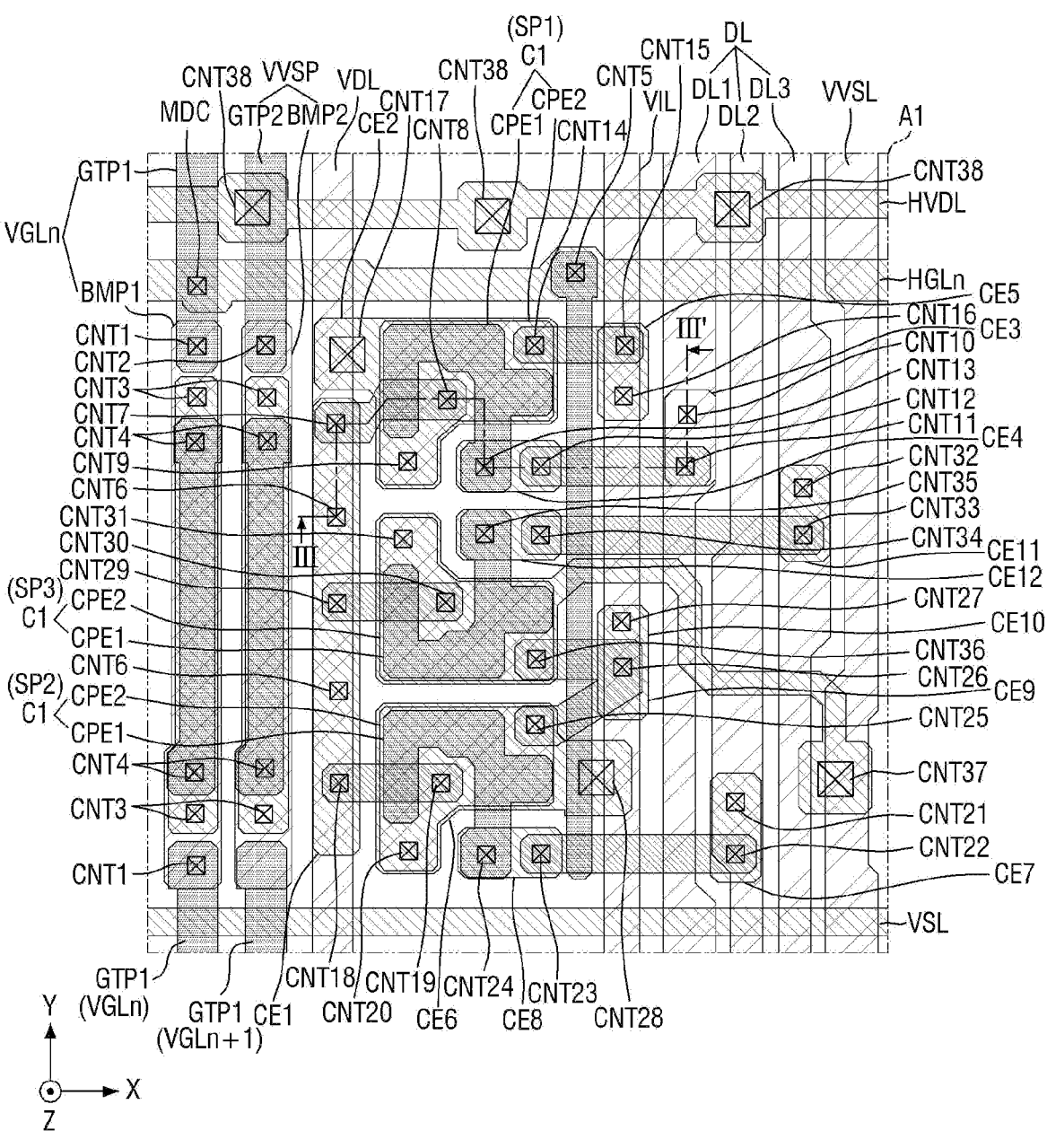
Figure 11:
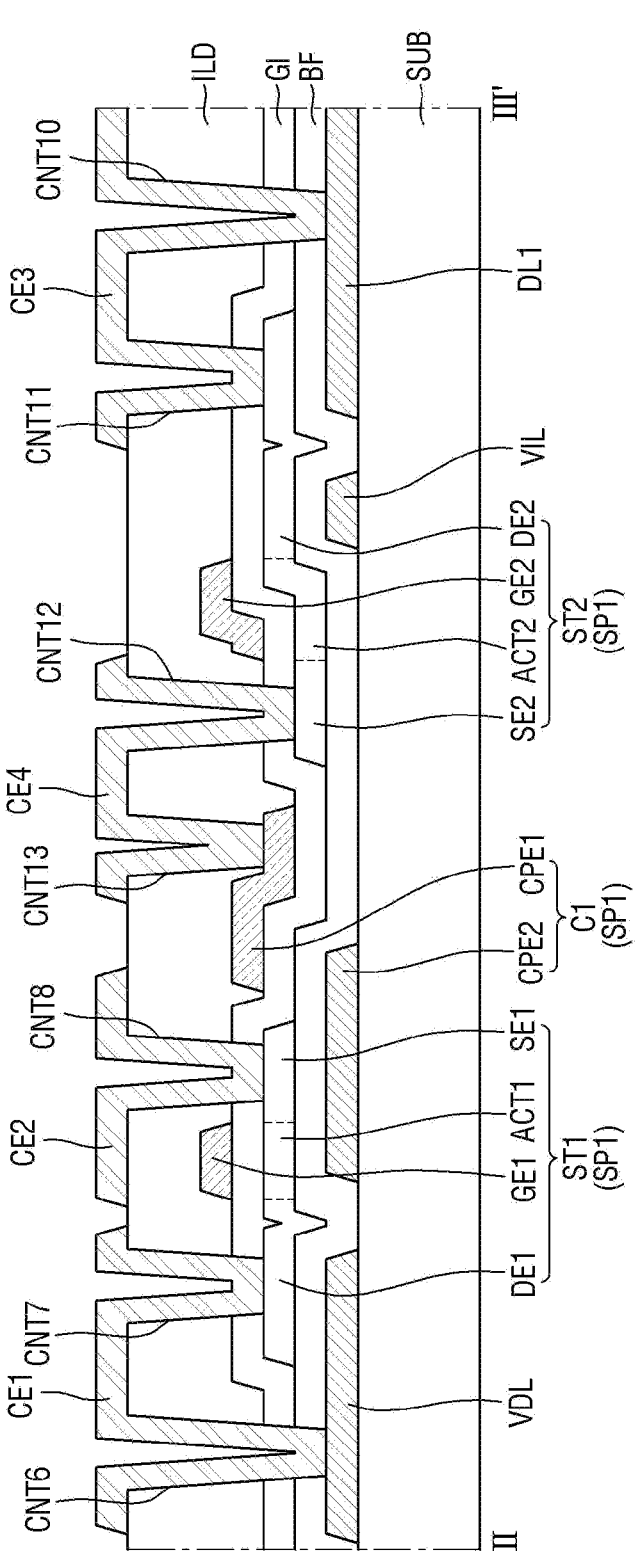
FIG. 11 is a schematic cross-sectional view taken along line III-III' of FIGS. 9 and 10.

FIG. 5 is a plan view illustrating a part of a display area in a display device according to an embodiment. FIG. 6 is a plan view illustrating a first metal layer and a second metal layer in the display device of FIG. 5. FIG. 7 is a schematic cross-sectional view taken along line I-I' of FIG. 5. FIG. 8 is a schematic cross-sectional view taken along line II-II' of FIG. 5. FIGS. 9 and 10 are enlarged views of area A1 of FIG. 5. FIG. 11 is a schematic cross-sectional view taken along line III-III' of FIGS. 9 and 10.

Referring to FIGS. 5 to 11, the display area DA may include a pixel SP, a gate line GL, a data line DL, an initialization voltage line VIL, a first voltage line VDL, a horizontal voltage line HVDL, a vertical voltage line VVSL, a second voltage line VSL, and a line pattern VVSP. The gate line GL may include a vertical gate line VGL, a horizontal gate line HGL, and an auxiliary gate line BGL.

At least one vertical gate line VGL may be disposed on a side or the left side of the pixel SP. At least one vertical gate line VGL may be disposed between the pixels SP. For example, the $(n-2)^{th}$ and $(n-1)^{th}$ vertical gate lines VGL, and VGLn−1 may be disposed on a side or the left side of the pixel SP. The $n^{th}$ and $(n+1)^{th}$ vertical gate lines VGLn and VGLn+1 may be disposed between the pixels SP.

The vertical gate line VGL may include a first metal pattern BMP1 and a third metal pattern GTP1. The first metal pattern BMP1 may be disposed in a first metal layer MTL1 (or the first metal layer MTL1 may include the first metal pattern BMP1, hereinafter "A disposed in B" may mean "B may include A"), and the third metal pattern GTP1 may be disposed in a second metal layer MTL2 that is disposed on the first metal layer MTL1. The vertical gate line VGL may be formed by alternately connecting the first and third metal patterns BMP1 and GTP1. The first metal patterns BMP1 may be spaced apart from each other in the second direction (Y-axis direction) with at least one of the horizontal gate line HGL, the horizontal voltage line HVDL, or the second voltage line VSL therebetween. The first metal patterns BMP1 spaced apart from each other may be electrically connected through the third metal pattern GTP1. The first and third metal patterns BMP1 and GTP1 may be electrically connected through a first contact hole CNT1. For example, the vertical gate line VGL may extend from a side of the display area DA to the contact portion MDC by alternately connecting the first and third metal patterns BMP1 and GTP1. The third metal pattern GTP1 of the vertical gate line VGL may be electrically connected to the horizontal gate line HGL disposed in a third metal layer MTL3 through the contact portion MDC. The third metal layer MTL3 may be disposed on an interlayer insulating layer ILD that covers the second metal layer MLT2. A part of the third metal pattern GTP1 electrically connected to the horizontal gate line HGL through the contact portion MDC may overlap a second metal pattern BMP2, but the third metal pattern GTP1 and the second metal pattern BMP2 may be insulated from each other. The third metal pattern GTP1 may be insulated from the second voltage line VSL while intersecting the second voltage line VSL.

At least one line pattern VVSP may be disposed on a side or the left side of the pixel SP. At least one line pattern VVSP may be disposed between the pixels SP. The line pattern VVSP may include a second metal pattern BMP2 and a fourth metal pattern GTP2. The second metal pattern BMP2 may be disposed in the first metal layer MTL1, and the fourth metal pattern GTP2 may be disposed in the second metal layer MTL2 that is disposed on the first metal layer MTL1. The shape of the second metal pattern BMP2 and the shape of the first metal pattern BMP1 may be the same, and the shape of the fourth metal pattern GTP2 and the shape of the third metal pattern GTP1 may be the same. The line pattern VVSP may be formed by alternately connecting the second and fourth metal patterns BMP2 and GTP2. The second and fourth metal patterns BMP2 and GTP2 may be electrically connected through a second contact hole CNT2. For example, the line pattern VVSP may extend from a region adjacent to the contact portion MDC to another side of the display area DA by alternately connecting the second and fourth metal patterns BMP2 and GTP2. The line pattern VVSP may be electrically connected to the vertical voltage line VVSL and the second voltage line VSL.

Among the metal patterns having the same shape disposed in the first metal layer MTL1, a metal pattern forming the vertical gate line VGL may correspond to the first metal pattern BMP1, and a metal pattern forming the line pattern VVSP may correspond to the second metal pattern BMP2. Among the metal patterns having the same shape disposed in the second metal layer MTL2, a metal pattern forming the vertical gate line VGL may correspond to the third metal pattern GTP1, and a metal pattern forming the line pattern VVSP may correspond to the fourth metal pattern GTP2. Accordingly, in the display device 10, the first and third metal patterns BMP1 and GTP1 may be electrically connected to form the vertical gate line VGL, and the second and fourth metal patterns BMP2 and GTP2 may be electrically connected to form the line pattern VVSP, so that the pixel areas may be recognized identically in an optical inspection even if the lengths of the vertical gate lines VGL and the lengths of the line patterns VVSP vary depending on the position of the contact portion MDC. Accordingly, the display device 10 may secure reliability by accurately determining the possibility of a defect in the optical inspection process of the pixel areas.

The display area DA may also include a first auxiliary metal pattern AUP1 and a second auxiliary metal pattern AUP2.

The first auxiliary metal pattern AUP1 may be disposed in the second metal layer MTL2. The first auxiliary metal patterns AUP1 may have the same shape. The first auxiliary metal pattern AUP1 may overlap the first metal pattern BMP1 or the second metal pattern BMP2 in a third direction (Z-axis direction). The first auxiliary metal pattern AUP1 may be electrically connected to the first metal pattern BMP1 or the second metal pattern BMP2 through fourth contact holes CNT4. The first auxiliary metal pattern AUP1 may be electrically connected to the first metal pattern BMP1 to reduce the line resistance of the vertical gate line VGL, and may be electrically connected to the second metal pattern BMP2 to reduce the line resistance of the line pattern VVSP.

The second auxiliary metal pattern AUP2 may be disposed in the third metal layer MTL3. The second auxiliary metal patterns AUP2 may have the same shape. The second auxiliary metal pattern AUP2 may overlap the first metal pattern BMP1 or the second metal pattern BMP2 in the third direction (Z-axis direction). The first and second auxiliary metal patterns AUP1 and AUP2 may overlap each other in the third direction. The second auxiliary metal pattern AUP2 may be electrically connected to the first metal pattern BMP1 or the second metal pattern BMP2 through third contact holes CNT3. The second auxiliary metal pattern AUP2 may be electrically connected to the first metal pattern BMP1 to reduce the line resistance of the vertical gate line VGL, and may be electrically connected to the second metal pattern BMP2 to reduce the line resistance of the line pattern VVSP.

The pixels SP may include first to third pixels SP1, SP2, and SP3. The pixel circuit of the first pixel SP1, the pixel circuit of the third pixel SP3, and the pixel circuit of the second pixel SP2 may be arranged in the opposite direction of the second direction (Y-axis direction). The pixel circuit of each of the first to third pixels SP1, SP2, and SP3 may be disposed in the pixel area.

The first voltage line VDL may be disposed in a first metal layer MTL1 on the substrate SUB. The first voltage line VDL may be disposed on a side or the left side of the pixel circuits of the first to third pixels SP1, SP2 and SP3. The first voltage line VDL may overlap a first connection electrode CE1 of the third metal layer MTL3 in a thickness direction (Z-axis direction). The first voltage line VDL may be electrically connected to the first connection electrode CE1 through sixth contact holes CNT6. The first connection electrode CE1 may be electrically connected to a drain electrode DE1 of the first transistor ST1 of the first pixel SP1 through a seventh contact hole CNT7, may be electrically connected to the drain electrode DE1 of the first transistor ST1 of the second pixel SP2 through an eighteenth contact hole CNT18, and may be electrically connected to the drain electrode DE1 of the first transistor ST1 of the third pixel SP3 through a twenty-ninth contact hole CNT29. Accordingly, the first voltage line VDL may supply a driving voltage to the first to third pixels SP1, SP2, and SP3 through the first connection electrode CE1.

The horizontal voltage line HVDL may be disposed in the third metal layer MTL3. The horizontal voltage line HVDL may be disposed on the upper side of the horizontal gate line HGL. The horizontal voltage line HVDL may be electrically connected to the first voltage line VDL to receive the driving voltage. The horizontal voltage line HVDL may stably maintain the driving voltage or the high potential voltage of the first voltage line VDL. The horizontal voltage line HVDL may supply the driving voltage or the high potential voltage to first electrodes RME1 of a fourth metal layer MTL4 through thirty-eighth contact holes CNT38.

The initialization voltage line VIL may be disposed in the first metal layer MTL1. The initialization voltage line VIL may be disposed on a side or the right side of the auxiliary gate line BGL. The initialization voltage line VIL may be electrically connected to a fifth connection electrode CE5 of the third metal layer MTL3 through a sixteenth contact hole CNT16, and the fifth connection electrode CE5 may be electrically connected to a source electrode SE3 of the third transistor ST3 of the first pixel SP1 through a fifteenth contact hole CNT15. The initialization voltage line VIL may be electrically connected to a ninth connection electrode CE9 of the third metal layer MTL3 through a twenty-seventh contact hole CNT27, and the ninth connection electrode CE9 may be electrically connected to the source electrodes SE3 of the third transistors ST3 of the second and third pixels SP2 and SP3 through a twenty-sixth contact hole CNT26. The source electrodes SE3 of the third transistors ST3 of the second and third pixels SP2 and SP3 may be integral with each other, but are not limited thereto. Accordingly, the initialization voltage line VIL may supply the initialization voltage to the third transistor ST3 of each of the first to third pixels SP1, SP2 and SP3 and may receive the sensing signal from the third transistor ST3.

The horizontal gate line HGL may be disposed in the third metal layer MTL3. The horizontal gate line HGL may be disposed on the upper side of the pixel circuit of the first pixel SP1. The horizontal gate line HGL may be electrically connected to the third metal pattern GTP1 of the vertical gate line VGL disposed in the second metal layer MTL2 through the contact portion MDC. The horizontal gate line HGL may supply a gate signal received from the vertical gate line VGL to the auxiliary gate line BGL.

The auxiliary gate line BGL may be disposed in the second metal layer MTL2. The second metal layer MTL2 may be disposed on a gate insulating layer GI covering an active layer ACTL. The auxiliary gate line BGL may be electrically connected to the horizontal gate line HGL of the third metal layer MTL3 through a fifth contact hole CNT5. The auxiliary gate line BGL may extend from the horizontal gate line HGL in a direction opposite to the second direction (Y-axis direction). The auxiliary gate line BGL may be disposed on another side or the right side of the pixel circuits of the first to third pixels SP1, SP2 and SP3. The auxiliary gate line BGL may supply a gate signal received from the horizontal gate line HGL to the second and third transistors ST2 and ST3 of each of the first to third pixels SP1, SP2, and SP3.

The first data line DL1 may be disposed in the first metal layer MTL1. The first data line DL1 may be disposed on a side or the right side of the initialization voltage line VIL. The first data line DL1 may be electrically connected to a third connection electrode CE3 of the third metal layer MTL3 through a tenth contact hole CNT10, and the third connection electrode CE3 may be electrically connected to a drain electrode DE2 of the second transistor ST2 of the first pixel SP1 through an eleventh contact hole CNT11. The first data line DL1 may supply a data voltage to the second transistor ST2 of the first pixel SP1.

The second data line DL2 may be disposed in the first metal layer MTL1. The second data line DL2 may be disposed on another side or the right side of the first data line DL1. The second data line DL2 may be electrically connected to a seventh connection electrode CE7 of the third metal layer MTL3 through a twenty-first contact hole CNT21, and the seventh connection electrode CE7 may be electrically connected to the drain electrode DE2 of the second transistor ST2 of the second pixel SP2 through a twenty-second contact hole CNT22. The second data line DL2 may supply a data voltage to the second transistor ST2 of the second pixel SP2.

The third data line DL3 may be disposed in the first metal layer MTL1. The third data line DL3 may be disposed on another side or the right side of the second data line DL2. The third data line DL3 may be electrically connected to an eleventh connection electrode CE11 of the third metal layer MTL3 through a thirty-second contact hole CNT32, and the eleventh connection electrode CE11 may be electrically connected to the drain electrode DE2 of the second transistor ST2 of the third pixel SP3 through a thirty-third contact hole CNT33. The third data line DL3 may supply a data voltage to the second transistor ST2 of the third pixel SP3.

The vertical voltage line VVSL may be disposed in the first metal layer MTL1. The vertical voltage line VVSL may be disposed on another side or the right side of the third data line DL3. The vertical voltage line VVSL may be electrically connected to the second voltage line VSL of the third metal layer MTL3. The vertical voltage line VVSL may supply a low potential voltage to the second voltage line VSL.

The second voltage line VSL may be disposed in the third metal layer MTL3. The second voltage line VSL may be disposed on the lower side of the pixel circuit of the second pixel SP2. The second voltage line VSL may supply the low potential voltage received from the vertical voltage line VVSL to the third electrode of each of the first to third pixels SP1, SP2, and SP3. Here, the third electrode of each of the first to third pixels SP1, SP2, and SP3 may be disposed in a fourth metal layer on the third metal layer MTL3.

The pixel circuit of the first pixel SP1 may include first to third transistors ST1, ST2 and ST3. The first transistor ST1 of the first pixel SP1 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to a fourth connection electrode CE4 of the third metal layer MTL3 through a thirteenth contact hole CNT13, and the fourth connection electrode CE4 may be electrically connected to a source electrode SE2 of the second transistor ST2 of the active layer ACTL through a twelfth contact hole CNT12.

The drain electrode DE1 and the source electrode SE1 of the first transistor ST1 may be made conductive by heat treatment of the active layer ACTL. The drain electrode DE1 of the first transistor ST1 may be electrically connected to the first connection electrode CE1 of the third metal layer MTL3 through the seventh contact hole CNT7, and the first connection electrode CE1 may be electrically connected to the first voltage line VDL through the sixth contact hole CNT6. The drain electrode DE1 of the first transistor ST1 may receive the driving voltage from the first voltage line VDL.

The source electrode SE1 of the first transistor ST1 may be electrically connected to a second connection electrode CE2 of the third metal layer MTL3 through an eighth contact hole CNT8. The second connection electrode CE2 may be electrically connected to a second capacitor electrode CPE2 of the first metal layer MTL1 through a ninth contact hole CNT9. Accordingly, the first capacitor C1 may be formed doubly between the first capacitor electrode CPE1 and the second capacitor electrode CPE2 and between the first capacitor electrode CPE1 and the second connection electrode CE2.

The second transistor ST2 of the first pixel SP1 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the third connection electrode CE3 of the third metal layer MTL3 through the eleventh contact hole CNT11, and the third connection electrode CE3 may be electrically connected to the first data line DL1 through the tenth contact hole CNT10. The drain electrode DE2 of the second transistor ST2 may receive the data voltage of the first pixel SP1 from the first data line DL1.

The source electrode SE2 of the second transistor ST2 may be electrically connected to the fourth connection electrode CE4 of the third metal layer MTL3 through the twelfth contact hole CNT12, and the fourth connection electrode CE4 may be electrically connected to the first capacitor electrode CPE1 through the thirteenth contact hole CNT13.

The third transistor ST3 of the first pixel SP1 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the second connection electrode CE2 of the third metal layer MTL3 through a fourteenth contact hole CNT14. The second connection electrode CE2 may be electrically connected to the first electrode of the first pixel SP1 through a seventeenth contact hole CNT17. Here, the first electrode of the first pixel SP1 may be disposed in the fourth metal layer.

The source electrode SE3 of the third transistor ST3 may be electrically connected to the fifth connection electrode CE5 of the third metal layer MTL3 through the fifteenth contact hole CNT15, and the fifth connection electrode CE5 may be electrically connected to the initialization voltage line VIL through the sixteenth contact hole CNT16. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to an eighth connection electrode CE8 through a twenty-fourth contact hole CNT24, and the eighth connection electrode CE8 may be electrically connected to the source electrode SE2 of the second transistor ST2 of the active layer ACTL through a twenty-third contact hole CNT23.

The drain electrode DE1 and the source electrode SE1 of the first transistor ST1 may be made conductive by heat treatment of the active layer. The drain electrode DE1 of the first transistor ST1 may be electrically connected to the first connection electrode CE1 of the third metal layer MTL3 through the eighteenth contact hole CNT18, and the first connection electrode CE1 may be electrically connected to the first voltage line VDL through the sixth contact hole CNT6. The drain electrode DE1 of the first transistor ST1 may receive the driving voltage from the first voltage line VDL.

The source electrode SE1 of the first transistor ST1 may be electrically connected to a sixth connection electrode CE6 of the third metal layer MTL3 through a nineteenth contact hole CNT19. The sixth connection electrode CE6 may be electrically connected to the second capacitor electrode CPE2 of the first metal layer MTL1 through a twentieth contact hole CNT20. Accordingly, the first capacitor C1 may be formed doubly between the first capacitor electrode CPE1 and the second capacitor electrode CPE2 and between the first capacitor electrode CPE1 and the sixth connection electrode CE6.

The second transistor ST2 of the second pixel SP2 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the seventh connection electrode CE7 of the third metal layer MTL3 through the twenty-second contact hole CNT22, and the seventh connection electrode CE7 may be electrically connected to the second data line DL2 through the twenty-first contact hole CNT21. The drain electrode DE2 of the second transistor ST2 may receive the data voltage of the second pixel SP2 from the second data line DL2.

The source electrode SE2 of the second transistor ST2 may be electrically connected to the eighth connection electrode CE8 of the third metal layer MTL3 through the twenty-third contact hole CNT23, and the eighth connection electrode CE8 may be electrically connected to the first capacitor electrode CPE1 through the twenty-fourth contact hole CNT24.

The third transistor ST3 of the second pixel SP2 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the sixth connection electrode CE6 of the third metal layer MTL3 through a twenty-fifth contact hole CNT25. The sixth connection electrode CE6 may be electrically connected to the first electrode of the second pixel SP2 through a twenty-eighth contact hole CNT28. Here, the first electrode of the second pixel SP2 may be disposed in the fourth metal layer.

The source electrode SE3 of the third transistor ST3 may be electrically connected to the ninth connection electrode CE9 of the third metal layer MTL3 through the twenty-sixth contact hole CNT26, and the ninth connection electrode CE9 may be electrically connected to the initialization voltage line VIL through the twenty-seventh contact hole CNT27. The source electrode SE3 of the third transistor ST3 may receive the initialization voltage from the initialization voltage line VIL. The source electrode SE3 of the third transistor ST3 may supply the sensing signal to the initialization voltage line VIL.

The pixel circuit of the third pixel SP3 may include first to third transistors ST1, ST2 and ST3. The first transistor ST1 of the third pixel SP3 may include an active region ACT1, a gate electrode GE1, a drain electrode DE1, and a source electrode SE1. The active region ACT1 of the first transistor ST1 may be disposed in the active layer ACTL and may overlap the gate electrode GE1 of the first transistor ST1 in the thickness direction (Z-axis direction).

The gate electrode GE1 of the first transistor ST1 may be disposed in the second metal layer MTL2. The gate electrode GE1 of the first transistor ST1 may be a part of the first capacitor electrode CPE1 of the first capacitor C1. The first capacitor electrode CPE1 may be electrically connected to a twelfth connection electrode CE12 through a thirty-fifth contact hole CNT35, and the twelfth connection electrode CE12 may be electrically connected to the source electrode SE2 of the second transistor ST2 of the active layer ACTL through a thirty-fourth contact hole CNT34.

The drain electrode DE1 and the source electrode SE1 of the first transistor ST1 may be made conductive by heat treatment of the active layer. The drain electrode DE1 of the first transistor ST1 may be electrically connected to the first connection electrode CE1 of the third metal layer MTL3 through the twenty-ninth contact hole CNT29, and the first connection electrode CE1 may be electrically connected to the first voltage line VDL through the sixth contact hole CNT6. The drain electrode DE1 of the first transistor ST1 may receive the driving voltage from the first voltage line VDL.

The source electrode SE1 of the first transistor ST1 may be electrically connected to a tenth connection electrode CE10 of the third metal layer MTL3 through a thirtieth contact hole CNT30. The tenth connection electrode CE10 may be electrically connected to the second capacitor electrode CPE2 of the first metal layer MTL1 through a thirty-first contact hole CNT31. Accordingly, the first capacitor C1 may be formed doubly between the first capacitor electrode CPE1 and the second capacitor electrode CPE2 and between the first capacitor electrode CPE1 and the tenth connection electrode CE10.

The second transistor ST2 of the third pixel SP3 may include an active region ACT2, a gate electrode GE2, a drain electrode DE2, and a source electrode SE2. The active region ACT2 of the second transistor ST2 may be disposed in the active layer ACTL and may overlap the gate electrode GE2 of the second transistor ST2 in the thickness direction (Z-axis direction).

The gate electrode GE2 of the second transistor ST2 may be disposed in the second metal layer MTL2. The gate electrode GE2 of the second transistor ST2 may be a part of the auxiliary gate line BGL.

The drain electrode DE2 and the source electrode SE2 of the second transistor ST2 may be made conductive by heat treatment of the active layer ACTL. The drain electrode DE2 of the second transistor ST2 may be electrically connected to the eleventh connection electrode CE11 of the third metal layer MTL3 through the thirty-third contact hole CNT33, and the eleventh connection electrode CE11 may be electrically connected to the third data line DL3 through the thirty-second contact hole CNT32. The drain electrode DE2 of the second transistor ST2 may receive the data voltage of the third pixel SP3 from the third data line DL3.

The source electrode SE2 of the second transistor ST2 may be electrically connected to the twelfth connection electrode CE12 of the third metal layer MTL3 through the thirty-fourth contact hole CNT34, and the twelfth connection electrode CE12 may be electrically connected to the first capacitor electrode CPE1 through the thirty-fifth contact hole CNT35.

The third transistor ST3 of the third pixel SP3 may include an active region ACT3, a gate electrode GE3, a drain electrode DE3, and a source electrode SE3. The active region ACT3 of the third transistor ST3 may be disposed in the active layer ACTL and may overlap the gate electrode GE3 of the third transistor ST3 in the thickness direction (Z-axis direction).

The gate electrode GE3 of the third transistor ST3 may be disposed in the second metal layer MTL2. The gate electrode GE3 of the third transistor ST3 may be a part of the auxiliary gate line BGL.

The drain electrode DE3 and the source electrode SE3 of the third transistor ST3 may be made conductive by heat treatment of the active layer ACTL. The drain electrode DE3 of the third transistor ST3 may be electrically connected to the tenth connection electrode CE10 of the third metal layer MTL3 through a thirty-sixth contact hole CNT36. The tenth connection electrode CE10 may be electrically connected to the first electrode of the third pixel SP3 through a thirty-seventh contact hole CNT37. Here, the first electrode of the third pixel SP3 may be disposed in the fourth metal layer.

The source electrode SE3 of the third transistor ST3 may be electrically connected to the ninth connection electrode CE9 of the third metal layer MTL3 through the twenty-sixth contact hole CNT26, and the ninth connection electrode CE9 may be electrically connected to the initialization voltage line VIL through the twenty-seventh contact hole CNT27. The source electrodes SE3 of the third transistors ST3 of the second and third pixels SP2 and SP3 may be integral with each other, but are not limited thereto. The source electrode SE3 of the third transistor ST3 may receive the initialization voltage from the initialization voltage line VIL. The source electrode SE3 of the third transistor ST3 may supply the sensing signal to the initialization voltage line VIL.

Figure 12:
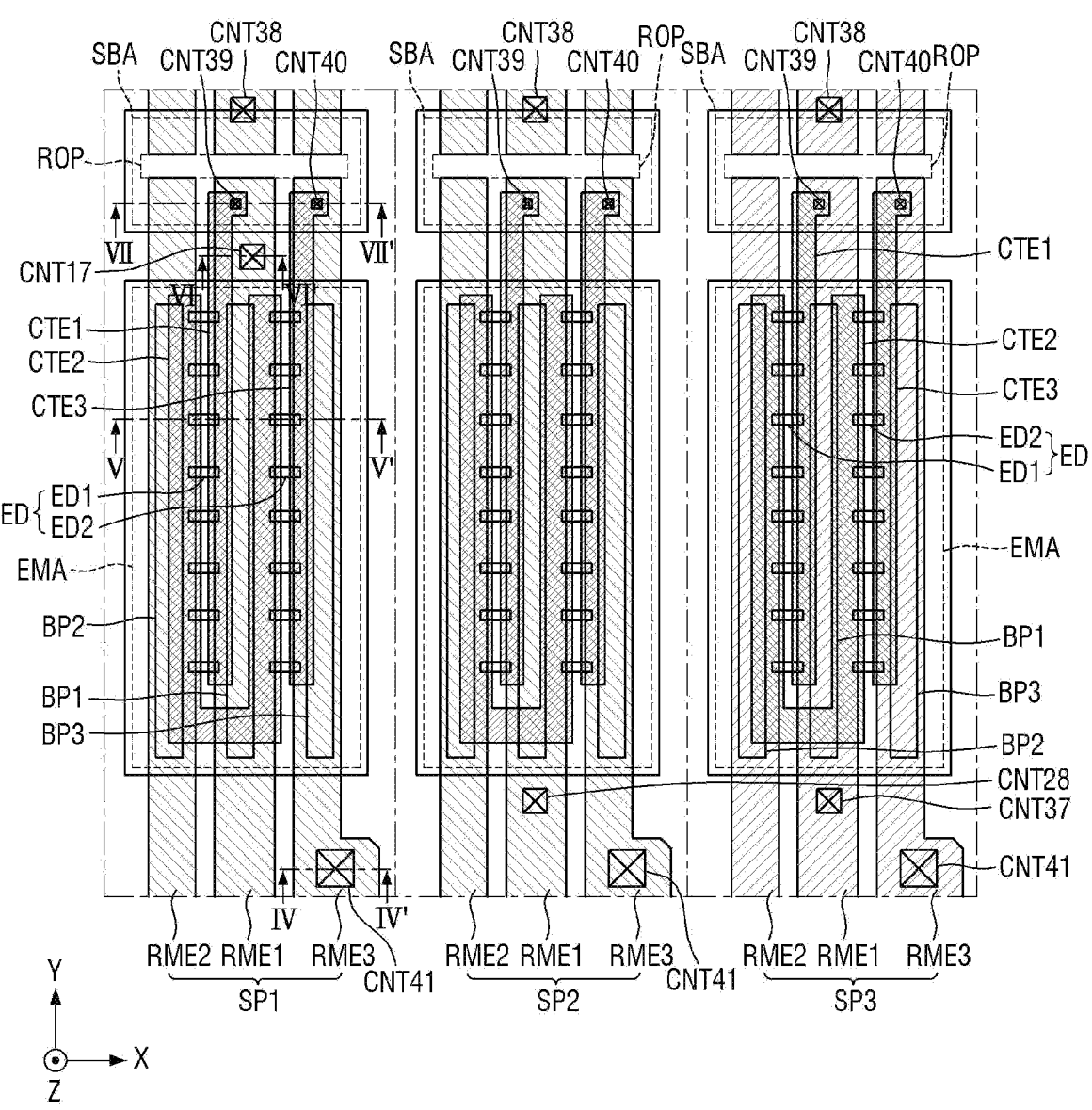
FIG. 12 is a plan view illustrating a light emitting element layer of a display device according to an embodiment.
Figure 13:
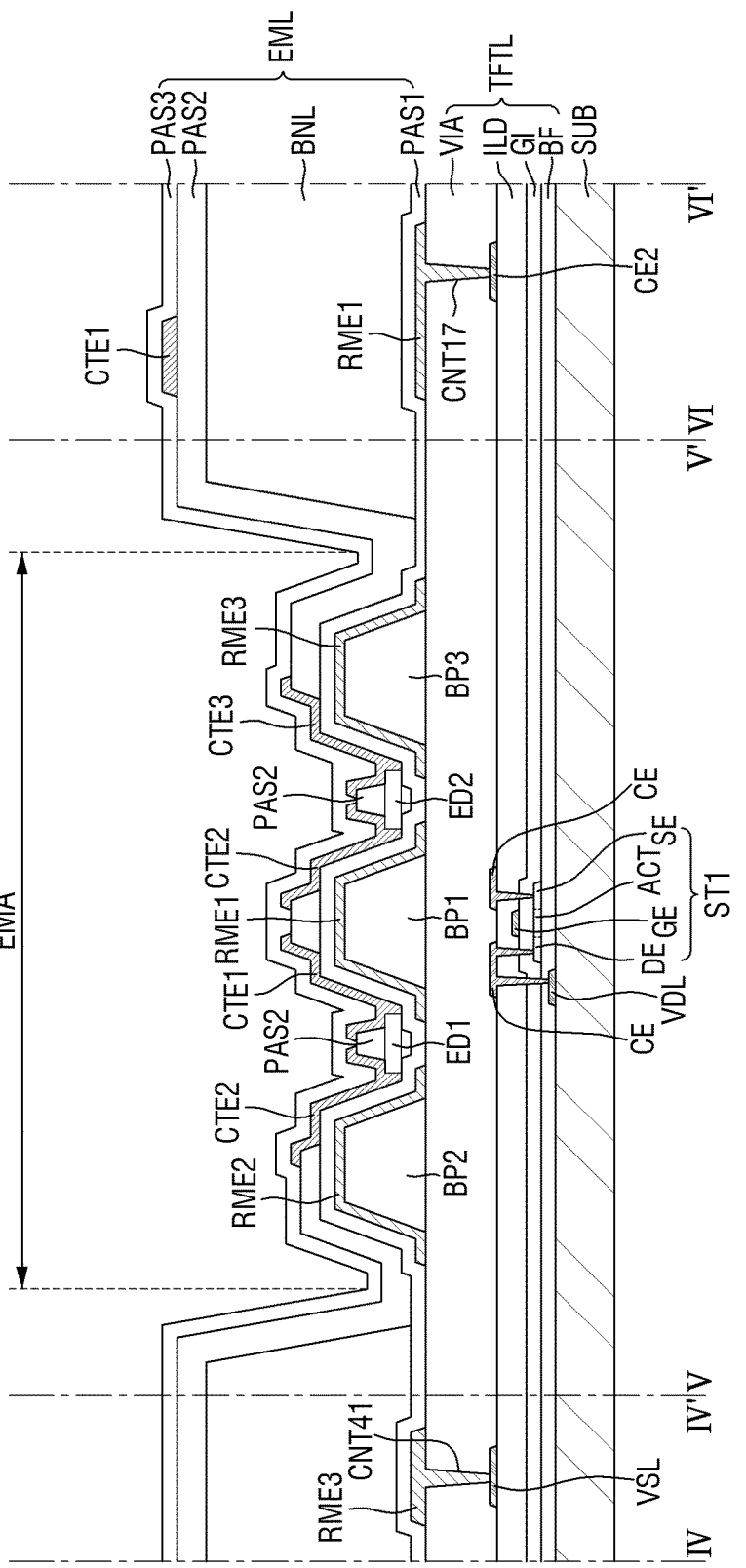
FIG. 13 is a schematic cross-sectional view taken along lines IV-IV', V-V', and VI-VI' of FIG. 12.
Figure 14:
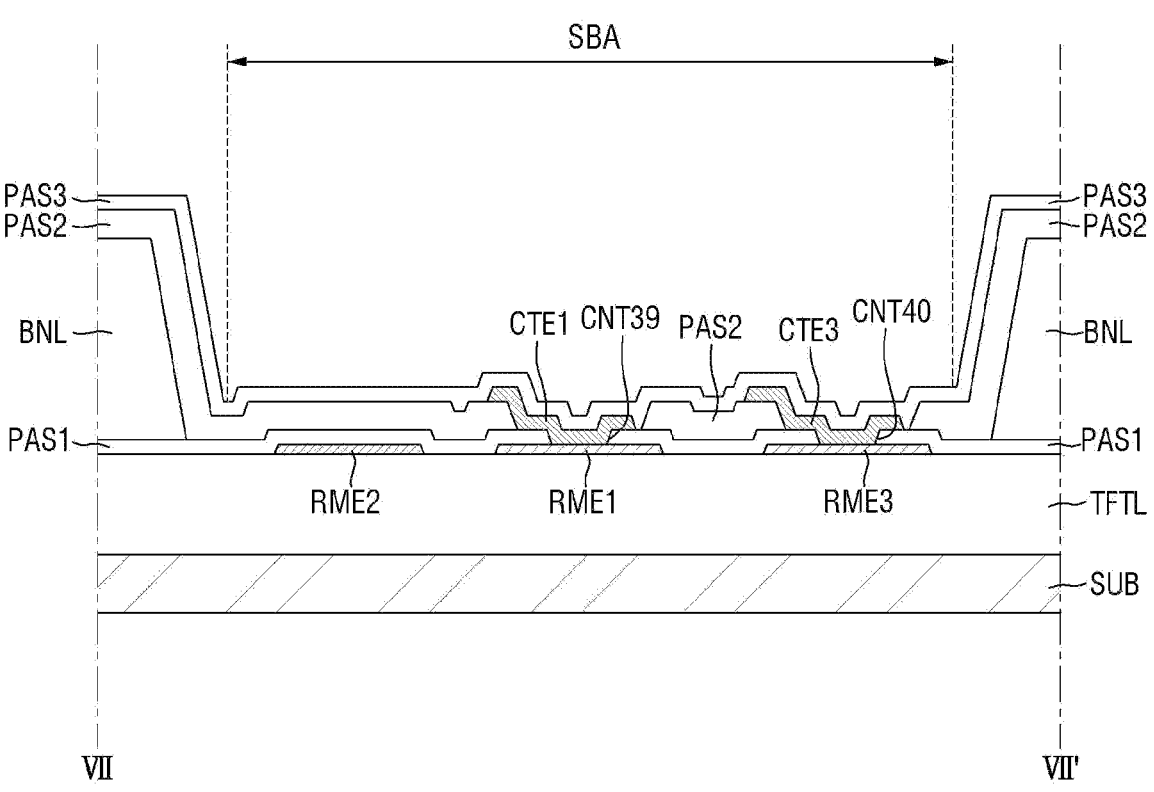
FIG. 14 is a schematic cross-sectional view taken along line VII-VII' of FIG. 12.

FIG. 12 is a plan view illustrating a light emitting element layer of a display device according to an embodiment. FIG. 13 is a schematic cross-sectional view taken along lines IV-IV', V-V', and VI-VI' of FIG. 12. FIG. 14 is a schematic cross-sectional view taken along line VII-VII' of FIG. 12.

Referring to FIGS. 12 to 14, a light emitting element layer EML of the display device 10 may be disposed on a thin film transistor layer TFTL. The light emitting element layer EML may include first to third bank patterns BP1, BP2, and BP3, first to third electrodes RME1, RME2, and RME3, the first and second light emitting elements ED1 and ED2, a first insulating layer PAS1, a bank layer BNL, a second insulating layer PAS2, first to third contact electrodes CTE1, CTE2, and CTE3, and a third insulating layer PAS3.

The first bank pattern BP1 may be disposed at the center of an emission area EMA, the second bank pattern BP2 may be disposed on the left side of the emission area EMA, and the third bank pattern BP3 may be disposed on the right side of the emission area EMA. Each of the first to third bank patterns BP1, BP2, and BP3 may protrude in the upward direction (Z-axis direction) on a via layer VIA. Each of the first to third bank patterns BP1, BP2, and BP3 may have an inclined side surface. Multiple first light emitting elements ED1 may be disposed between the first and second bank patterns BP1 and BP2 spaced apart from each other, and multiple second light emitting elements ED2 may be disposed between the second and third bank patterns BP2 and BP3 spaced apart from each other. The first to third bank patterns BP1, BP2, and BP3 may have the same length in the second direction (Y-axis direction) and different lengths in the first direction (X-axis direction), but are not limited thereto. The first to third bank patterns BP1, BP2, and BP3 may be disposed in island-like patterns throughout the display area DA.

The first to third electrodes RME1, RME2, and RME3 of each of the first to third pixels SP1, SP2 and SP3 may be disposed in the fourth metal layer MTL4. The fourth metal layer MTL4 may be disposed on the via layer VIA and the first to third bank patterns BP1, BP2, and BP3. The first electrode RME1 may extend in the second direction (Y-axis direction) on the center of the emission area EMA. The first electrode RME1 may cover a top surface and an inclined side surface of the first bank pattern BP1. Accordingly, the first electrode RME1 may reflect the light emitted from the first and second light emitting elements ED1 and ED2 in the upward direction (Z-axis direction).

The second electrode RME2 may extend in the second direction (Y-axis direction) on the left side of the emission area EMA. The second electrode RME2 may cover a top surface and an inclined side surface of the second bank pattern BP2. Accordingly, the second electrode RME1 may reflect the light emitted from the first light emitting element ED1 in the upward direction (Z-axis direction).

The third electrode RME3 may extend in the second direction (Y-axis direction) on the right side of the emission area EMA. The third electrode RME3 may cover the top surface and the inclined side surface of the third bank pattern BP3. Accordingly, the third electrode RME3 may reflect the light emitted from the second light emitting element ED2 in the upward direction (Z-axis direction).

One ends of the first to third electrodes RME1, RME2, and RME3 may be separated from the electrodes in another row by the separation portion ROP. The first to third electrodes RME1, RME2, and RME3 may be alignment electrodes that align the first and second light emitting elements ED1 and ED2 during the manufacturing process of the display device 10. The first electrode RME1 may be electrically connected to the horizontal voltage line HVDL of the third metal layer MTL3 through a thirty-eighth contact hole CNT38 before separation, and may receive a driving voltage or a high potential voltage to function as the alignment electrode. The first to third electrodes RME1, RME2, and RME3 may be separated by the separation portion ROP after the alignment process of the light emitting elements ED is completed.

The first electrode RME1 of the first pixel SP1 may be electrically connected to the second connection electrode CE2 of the third metal layer MTL3 through the seventeenth contact hole CNT17. The first electrode RME1 may receive the driving current from the second connection electrode CE2 through the first transistor ST1. The first electrode RME1 may supply a driving current to the first light emitting elements ED1 of the first pixel SP1 through the first contact electrode CTE1.

The third electrode RME3 of the first pixel SP1 may be electrically connected to the second voltage line VSL of the third metal layer MTL3 through a forty-first contact hole CNT41. Accordingly, the third electrode RME3 of the first pixel SP1 may receive a low potential voltage from the second voltage line VSL.

The first electrode RME1 of the second pixel SP2 may be electrically connected to the sixth connection electrode CE6 of the third metal layer MTL3 through the twenty-eighth contact hole CNT28. The first electrode RME1 may receive the driving current from the sixth connection electrode CE6 through the first transistor ST1. The first electrode RME1 may supply a driving current to the first light emitting elements ED1 of the second pixel SP2 through the first contact electrode CTE1.

The third electrode RME3 of the second pixel SP2 may be electrically connected to the second voltage line VSL of the third metal layer MTL3 through the forty-first contact hole CNT41. Accordingly, the third electrode RME3 of the second pixel SP2 may receive a low potential voltage from the second voltage line VSL.

The first electrode RME1 of the third pixel SP3 may be electrically connected to the tenth connection electrode CE10 of the third metal layer MTL3 through the thirty-seventh contact hole CNT37. The first electrode RME1 may receive a driving current from the tenth connection electrode CE10 through the first transistor ST1. The first electrode RME1 may supply a driving current to the first light emitting elements ED1 of the third pixel SP3 through the first contact electrode CTE1.

The third electrode RME3 of the third pixel SP3 may be electrically connected to the second voltage line VSL of the third metal layer MTL3 through the forty-first contact hole CNT41. Accordingly, the third electrode RME3 of the third pixel SP3 may receive a low potential voltage from the second voltage line VSL.

The first light emitting elements ED1 may be aligned between the first electrode RME1 and the second electrode RME2. The first insulating layer PAS1 may cover the first to third electrodes RME1, RME2, and RME3. The first light emitting elements ED1 may be insulated from the first and second electrodes RME1 and RME2 by the first insulating layer PAS1. Before the first and second electrode RME1 and RME2 are separated by the separation portion ROP, each of the first and second electrodes RME1 and RME2 may receive the alignment signal, and the electric field may be formed between the first and second electrodes RME1 and RME2. For example, the first light emitting elements ED1 may be sprayed between the first and second electrodes RME1 and RME2 through an inkjet printing process, and the first light emitting elements ED1 dispersed in ink may be aligned by a dielectrophoretic force due to the electric field formed between the first and second electrodes RME1 and RME2. Accordingly, the first light emitting elements ED1 may be aligned in the first direction (X-axis direction) between the first and second electrodes RME1 and RME2.

The second light emitting elements ED2 may be aligned between the first electrode RME1 and the third electrode RME3. The second light emitting elements ED2 may be insulated from the first and third electrodes RME1 and RME3 by the first insulating layer PAS1. Before the first and third electrode RME1 and RME3 are separated by the separation portion ROP, each of the first and third electrode RME1 and RME3 may receive the alignment signal, and the electric field may be formed between the first and third electrode RME1 and RME3. For example, the second light emitting elements ED2 may be sprayed between the first and third electrodes RME1 and RME3 through the inkjet printing process, and the second light emitting elements ED2 dispersed in ink may be aligned by a dielectrophoretic force due to the electric field formed between the first and third electrodes RME1 and RME3. Accordingly, the second light emitting elements ED2 may be aligned in the first direction (X-axis direction) between the first and third electrodes RME1 and RME3.

The first to third contact electrodes CTE1, CTE2, and CTE3 of each of the first to third pixels SP1, SP2, and SP3 may be disposed on the first to third electrodes RME1, RME2, and RME3. The second insulating layer PAS2 may be disposed on the bank layer BNL, the first insulating layer PAS1, and the central portions of the light emitting elements ED. The third insulating layer PAS3 may cover the second insulating layer PAS2 and the first to third contact electrodes CTE1, CTE2, and CTE3. The second and third insulating layers PAS2 may insulate each of the first to third contact electrodes CTE1, CTE2, and CTE3.

The first contact electrode CTE1 may be disposed on the first electrode RME1, and electrically connected to the first electrode RME1 through a thirty-ninth contact hole CNT39. The first contact electrode CTE1 may be electrically connected between the first electrode RME1 and ends of the first light emitting elements ED1. The first contact electrode CTE1 may correspond to an anode electrode of the first light emitting elements ED1, but the disclosure is not limited thereto.

The second contact electrode CTE2 may be disposed on the first and second electrodes RME1 and RME2, and be insulated from the first and second electrodes RME1 and RME2. The first portion of the second contact electrode CTE2 may be disposed on the second electrode RME2, and extend in the second direction (Y-axis direction). The second portion of the second contact electrode CTE2 may be bent from the lower side of the first portion thereof to extend in the first direction (X-axis direction). The third portion of the second contact electrode CTE2 may be bent from the right side of the second portion thereof to extend in the second direction (Y-axis direction) and may be disposed on the first electrode RME1.

The second contact electrode CTE2 may be electrically connected between another ends of the first light emitting elements ED1, and ends of the second light emitting elements ED2. The second contact electrode CTE2 may correspond to the third node N3 of FIG. 4. The second contact electrode CTE2 may correspond to a cathode electrode of the first light emitting elements ED1, but is not limited thereto. The second contact electrode CTE2 may correspond to an anode electrode of the second light emitting elements ED2, but is not limited thereto.

The third contact electrode CTE3 may be disposed on the third electrode RME3, and may be electrically connected to the third electrode RME3 through a forty contact hole CNT40. The third contact electrode CTE3 may be electrically connected between the other ends of the second light emitting elements ED2 and the third electrode RME3. The third contact electrode CTE3 may correspond to a cathode electrode of the second light emitting elements ED2, but is not limited thereto. The third contact electrode CTE3 may receive the low potential voltage through the third electrode RME3.

A thin film transistor TFT of the thin film transistor layer TFTL may include an active region ACT, a gate electrode GE, a drain electrode DE, and a source electrode SE. The drain electrode DE of the thin film transistor TFT may receive a driving voltage from the first voltage line VDL of the first metal layer MTL1 through the connection electrode CE.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a data line disposed on a substrate and extending in a first direction;
a first gate line disposed on the data line and extending in a second direction intersecting the first direction;
a voltage line extending in the second direction, the voltage line and the first gate line disposed on a same layer;
first metal patterns and second metal patterns extending in the first direction, the first metal patterns, the second metal patterns, and the data line disposed on a same layer; and
third metal patterns and fourth metal patterns extending in the first direction, the third metal patterns and the fourth metal patterns disposed on at least one of the first metal patterns and the second metal patterns, wherein
the first metal patterns and the third metal patterns are electrically connected to the first gate line, and
the second metal patterns and the fourth metal patterns are electrically connected to the voltage line.

2. The display device of claim 1, wherein
the first metal patterns and the second metal patterns have a same shape, and
the third metal patterns and the fourth metal patterns have a same shape.

3. The display device of claim 1, wherein the first to fourth metal patterns are collinear with each other in the first direction.

4. The display device of claim 1, wherein the first metal patterns and the third metal patterns are alternately electrically connected to form a second gate line extending in the first direction.

5. The display device of claim 4, further comprising:

a flexible film disposed on a side of the substrate; and a display driver disposed on the flexible film, wherein the second gate line supplies a gate signal received from the display driver to the first gate line.

6. The display device of claim 1, wherein the second metal patterns and the fourth metal patterns are alternately electrically connected to form a line pattern extending in the first direction.

7. The display device of claim 1, wherein the first metal patterns and the second metal patterns are spaced apart from each other, and the first gate line or the voltage line is disposed between the first metal patterns and the second metal patterns.

8. The display device of claim 7, wherein the first metal patterns are spaced apart from each other, and the first metal patterns are electrically connected to each other through a corresponding one of the third metal patterns.

9. The display device of claim 7, wherein the second metal patterns are spaced apart from each other, and the second metal patterns are electrically connected to each other through a corresponding one of the fourth metal patterns.

10. The display device of claim 1, wherein the first gate line is electrically connected to a corresponding one of the third metal patterns through a contact portion.

11. The display device of claim 10, wherein the third metal patterns are insulated from the second metal patterns and partially overlap a corresponding one of the second metal patterns in a thickness direction.

12. The display device of claim 1, wherein the third metal patterns are insulated from the voltage line and overlap the voltage line in a thickness direction.

13. The display device of claim 1, further comprising:

pixels electrically connected to the data line and the first gate line, wherein the voltage line supplies a low potential voltage to the pixels.

14. A display device comprising:

a data line extending in a first direction;

a first gate line disposed on the data line and extending in a second direction intersecting the first direction;

first metal patterns and second metal patterns extending in the first direction, the first metal patterns, the second metal patterns, and the data line disposed on a same layer; and third metal patterns and fourth metal patterns extending in the first direction, the third metal patterns and the fourth metal patterns disposed on at least one of the first metal patterns and the second metal patterns; and a voltage line extending in the second direction, the voltage line and the first gate line disposed on a same layer, wherein the first metal patterns and the third metal patterns are electrically connected to the first gate line, the second metal patterns and the fourth metal patterns are electrically connected to each other and insulated from the first gate line, and wherein the second metal patterns and the fourth metal patterns are electrically connected to the voltage line.

15. The display device of claim 14, wherein the first metal patterns and the second metal patterns have a same shape, and the third metal patterns and the fourth metal patterns have a same shape.

16. A display device comprising:

a data line included in a first metal layer disposed on a substrate and extending in a first direction;

first metal patterns and second metal patterns included in the first metal layer extending in the first direction;

third metal patterns and fourth metal patterns included in a second metal layer extending in the first direction, the second metal layer disposed on the first metal layer;

a first gate line included in a third metal layer extending in a second direction intersecting the first direction, the third metal layer disposed on the second metal layer; and a second gate line formed by alternately electrically connecting the first metal patterns and the third metal patterns, the second gate line extending in the first direction, wherein at least one of the third metal patterns partially overlaps one of the second metal patterns in a thickness direction, and the third metal patterns and the second metal patterns are insulated from each other.

17. The display device of claim 16, further comprising:

an auxiliary gate line included in the second metal layer electrically connected to the first gate line; and a pixel receiving a gate signal from the auxiliary gate line.

18. The display device of claim 17, further comprising:

a first voltage line included in the first metal layer extending in the first direction; and a second voltage line included in the third metal layer extending in the second direction, wherein the first voltage line supplies a high potential voltage to the pixel, and the second voltage line supplies a low potential voltage to the pixel.

19. The display device of claim 18, wherein the second metal patterns and the fourth metal patterns receive a low potential voltage from the second voltage line.

* * * * *